United States Patent
Ji et al.

(10) Patent No.: US 12,089,412 B2
(45) Date of Patent: Sep. 10, 2024

(54) VERTICAL STRING DRIVER WITH EXTENDED GATE JUNCTION STRUCTURE

(71) Applicant: INTEL NDTM US LLC, Santa Clara, CA (US)

(72) Inventors: Dong Ji, Santa Clara, CA (US); Guangyu Huang, El Dorado Hills, CA (US); Deepak Thimmegowda, Fremont, CA (US)

(73) Assignee: INTEL NDTM US LLC, Santa Clara, CA (US)

( * ) Notice: Subject to any disclaimer, the term of this patent is extended or adjusted under 35 U.S.C. 154(b) by 839 days.

(21) Appl. No.: 16/831,623

(22) Filed: Mar. 26, 2020

(65) Prior Publication Data
US 2020/0227429 A1    Jul. 16, 2020

(51) Int. Cl.
*H10B 43/40* (2023.01)
*H01L 21/02* (2006.01)
*H01L 29/04* (2006.01)
*H01L 29/06* (2006.01)
*H01L 29/16* (2006.01)
(Continued)

(52) U.S. Cl.
CPC ....... *H10B 43/40* (2023.02); *H01L 21/02532* (2013.01); *H01L 21/02554* (2013.01); *H01L 21/02595* (2013.01); *H01L 29/04* (2013.01); *H01L 29/0634* (2013.01); *H01L 29/16* (2013.01); *H01L 29/22* (2013.01); *H01L 29/4916* (2013.01); *H01L 29/66666* (2013.01); *H01L 29/66969* (2013.01);
(Continued)

(58) Field of Classification Search
CPC ........ H10B 43/40; H10B 43/27; H10B 43/10; H10B 43/50; H10B 41/27; H10B 41/41; H10B 41/10; H10B 41/50; H01L 21/02532; H01L 21/02554; H01L 21/02595; H01L 29/04; H01L 29/0634; H01L 29/16; H01L 29/22; H01L 29/4916; H01L 29/66666; H01L 29/66969; H01L 29/7827

See application file for complete search history.

(56) References Cited

U.S. PATENT DOCUMENTS 7,851,858 B2   12/2010   Yoshino et al.
8,552,496 B2   10/2013   Disney
(Continued)

OTHER PUBLICATIONS

Abouelatta-Ebrahim, Mohamed, et al., "Design considerations of high voltage RESURF nLDMOS: An analytical and numerical study", Ain Shams University, Ain Shams Engineering Journal, Available online Feb. 7, 2015, 9 pages.
(Continued)

*Primary Examiner* — Dao H Nguyen
(74) *Attorney, Agent, or Firm* — Compass IP Law PC

(57) ABSTRACT

A driver circuit for a three-dimensional (3D) memory device has a super junction structure as a field management structure. The super junction structure could be referred to as an extended junction structure, which distributes the electrical field of the junction between the vertical channel and the gate conductor for a string driver. The vertical channel includes a channel conductor to connect vertically between a source conductor and a drain conductor. The extended junction structure extends in parallel with the vertical channel conductor, extending vertically toward the drain conductor, having a height greater than a height of the gate conductor.

22 Claims, 22 Drawing Sheets

(51) Int. Cl.
    *H01L 29/22*   (2006.01)
    *H01L 29/49*   (2006.01)
    *H01L 29/66*   (2006.01)
    *H01L 29/78*   (2006.01)
    *H10B 41/27*   (2023.01)
    *H10B 41/41*   (2023.01)
    *H10B 43/27*   (2023.01)

(52) U.S. Cl.
    CPC ......... *H01L 29/7827* (2013.01); *H10B 41/27* (2023.02); *H10B 41/41* (2023.02); *H10B 43/27* (2023.02)

(56) References Cited

U.S. PATENT DOCUMENTS

| | | | |
|---|---|---|---|
| 9,053,977 B2* | 6/2015 | Choi | H10B 43/27 |
| 9,209,199 B2 | 12/2015 | Simsek-Ege et al. | |
| 9,490,322 B2 | 11/2016 | Yang et al. | |
| 9,595,535 B1* | 3/2017 | Ogawa | H10B 43/50 |
| 9,653,556 B1 | 5/2017 | Yang | |
| 10,074,661 B2* | 9/2018 | Sakakibara | H01L 29/1037 |
| 10,381,450 B1 | 8/2019 | Yada et al. | |
| 10,784,312 B1* | 9/2020 | Kabuyanagi | G11C 13/003 |
| 11,018,255 B2 | 5/2021 | Liu et al. | |
| 11,088,163 B2* | 8/2021 | Kanamori | H01L 29/7827 |
| 11,699,754 B2* | 7/2023 | Song | H01L 29/7827 |
| | | | 257/329 |
| 2008/0135929 A1 | 6/2008 | Saito et al. | |
| 2011/0215399 A1 | 9/2011 | Matsuura et al. | |
| 2012/0313691 A1 | 12/2012 | Mikhalev et al. | |
| 2016/0240254 A1 | 8/2016 | Chen | |
| 2018/0277641 A1 | 9/2018 | Karmous | |
| 2019/0043873 A1 | 2/2019 | Hasnat et al. | |
| 2019/0067475 A1* | 2/2019 | Liu | H01L 29/267 |
| 2019/0198515 A1* | 6/2019 | Hosoda | H10B 43/35 |
| 2020/0227525 A1* | 7/2020 | Ji | H01L 29/407 |
| 2021/0384354 A1* | 12/2021 | Karda | H01L 29/78642 |

OTHER PUBLICATIONS

Extended European Search Report for Patent Application No. 20209733.3, Mailed May 14, 2021, 8 pages.
First Office Action for U.S. Appl. No. 16/831,558, Mailed Nov. 2, 2023, 18 pages.

* cited by examiner

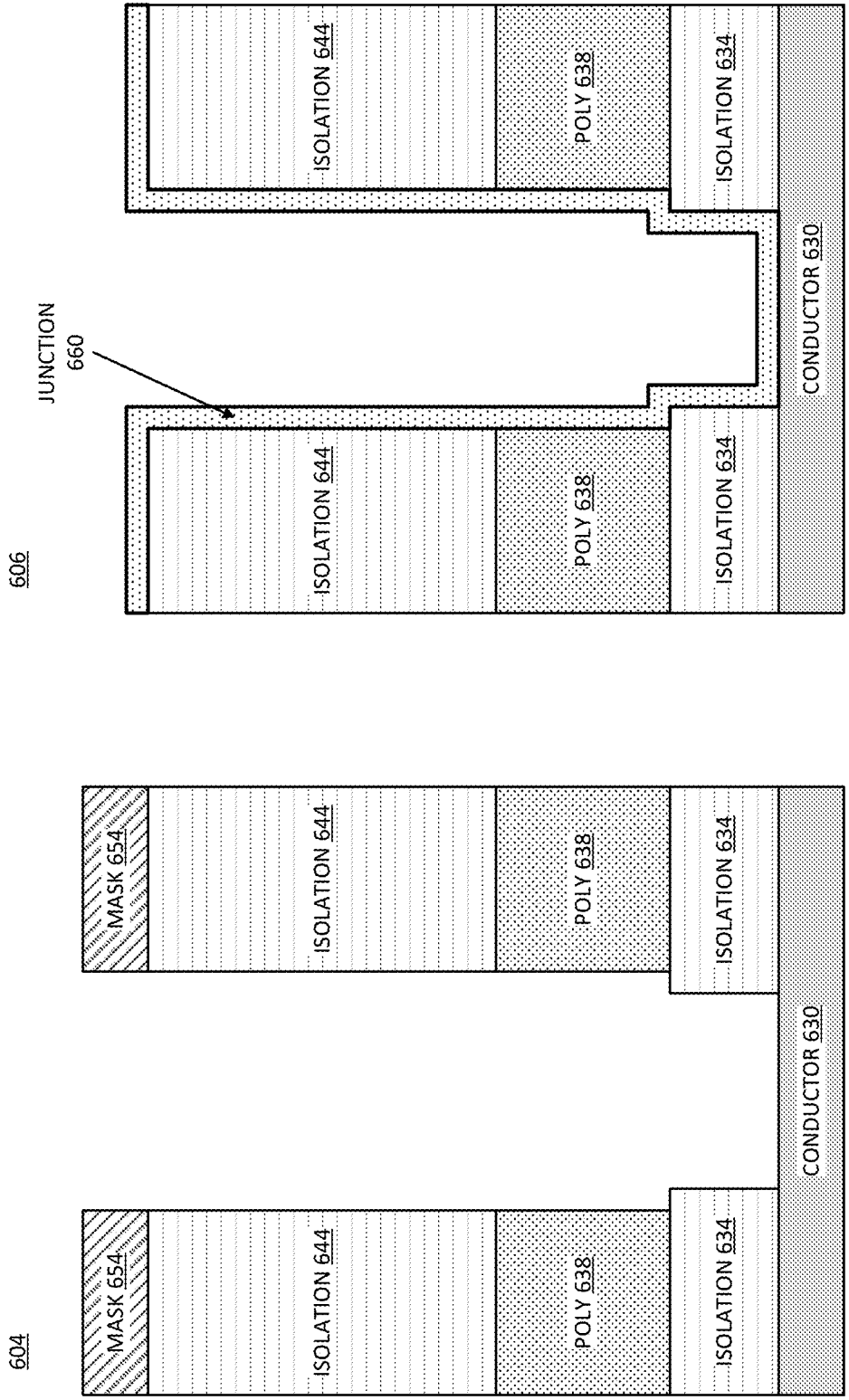

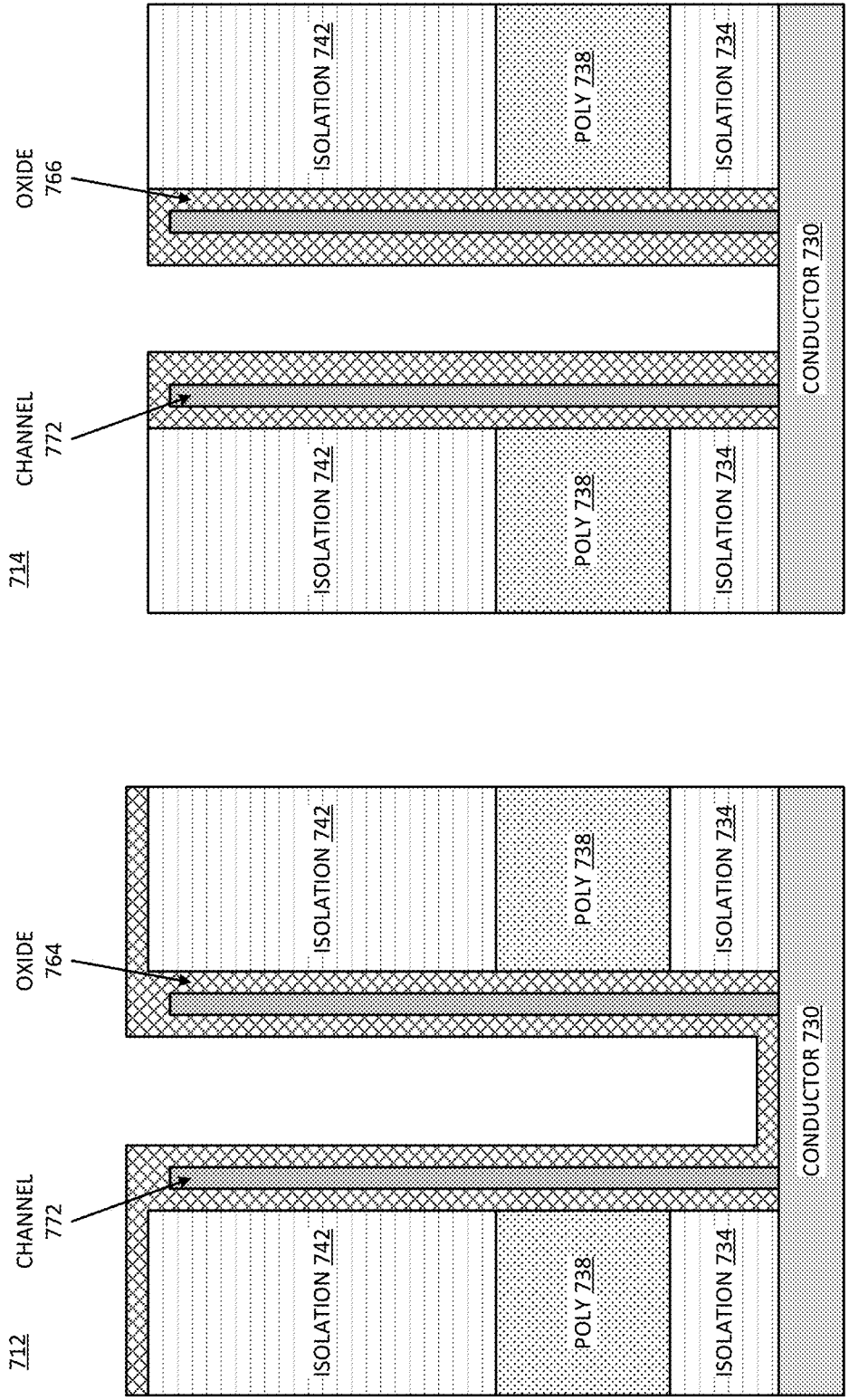

VERTICAL STRING DRIVER WITH EXTENDED GATE JUNCTION STRUCTURE

FIELD

Descriptions are generally related to three dimensional memory structures, and more particular descriptions are related to a vertical string driver.

BACKGROUND

Three-dimensional (3D) memory devices include stacked, 3D memory arrays that have increased bit density as compared to horizontal memory arrays. A stacked memory array refers to a memory array with a 3D architecture that has bit cells in horizontal directions as well as vertical stacks of layers. The bit density per unit of integrated circuit area is higher in stacked arrays because the cells can be formed around vertical channels instead of only around a horizontal channel. Stacked memory arrays have strings of bits that can be controlled with a string driver.

Even though the memory array is vertically stacked, the traditional string driver for stacked silicon CMOS (complementary metal-oxide semiconductor) devices has a horizontal geometry that is buried under the stacked array. Emerging manufacturing processes are able to shrink the channels and reduce the horizontal layout of the 3D arrays. However, the string drivers with horizontal geometry need an area on the die that restricts the ability to increase the density of the vertical channels. Thus, the restriction of increasing density in the horizontal geometries can limit the developmental roadmap for scaling vertical memory devices to higher densities.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIGS. 6A-6L are diagrammatic representations of a cross-section of stages of processing of a vertical string driver with a gate-connected junction.

FIGS. 7A-7L are diagrammatic representations of a cross-section of stages of processing of a vertical string driver with a source-connected junction.

Figure 1:
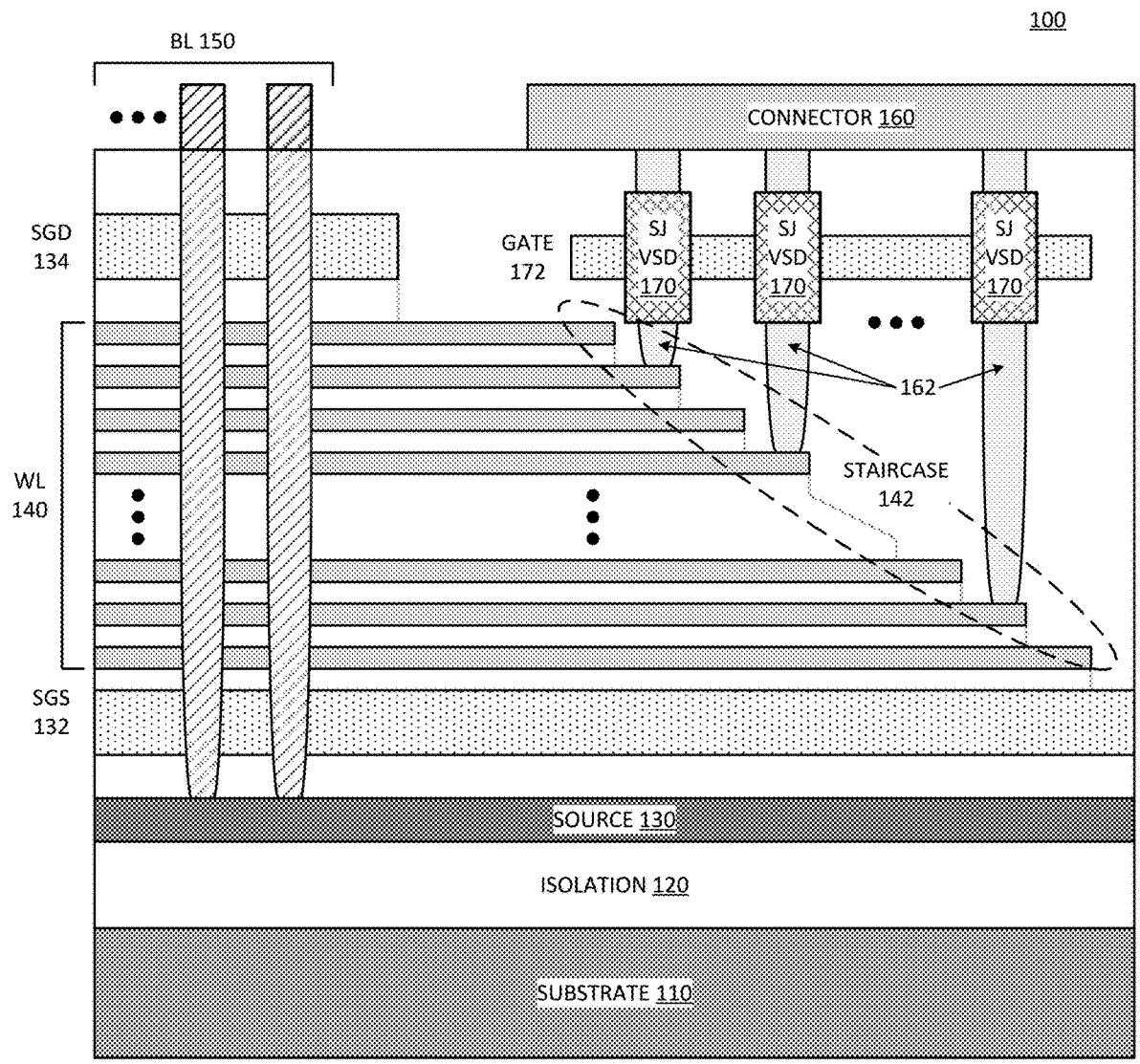
FIG. 1 is a representation of an example of a cross section of a circuit with a stacked memory having a staircase region with vertical string drivers having an extended gate junction structure.

Descriptions of certain details and implementations follow, including non-limiting descriptions of the figures, which may depict some or all examples, and well as other potential implementations.

DETAILED DESCRIPTION

As described herein, a driver circuit for a three-dimensional (3D) memory device has a super junction structure as a field management structure. The super junction structure could be referred to as an extended junction structure, which distributes the electrical field of the junction between the vertical channel and the gate conductor for a string driver. The vertical channel includes a channel conductor to connect vertically between a source conductor and a drain conductor. The extended junction structure extends in parallel with the vertical channel conductor, extending vertically toward the drain conductor, having a height greater than a height of the gate conductor.

The condition when a voltage differential exists between the source conductor and the drain conductor and the gate conductor is not biased can be referred to as the off state of the string driver, where the string driver is holding back a high voltage. The extended junction structure distributes the electrical field of the interface between the vertical channel and the gate conductor, reducing the overall electric field strength at any given point. More specifically, the distribution of the electric field can reduce the field at a corner of the gate conductor with the channel. Thus, the extended junction structure can adjust the electrical response of the driver circuit, enabling the circuit to have a higher breakdown voltage and improved drive current. Thus, the driver circuit can enable a scalable vertical string driver that is above the memory array instead of under the memory array circuitry.

An example of a stacked memory array includes a 3D NAND (memory cells that store a cell with inverted AND gates) array. String drivers for a 3D NAND memory device can be required to block a drain-to-source voltage in excess of 20 V, or approximately around 30 V in certain implementations. Such a high voltage exceeds the structural limit of convention thin film transistors, such as those that would be used for vertical string drivers.

A vertical string driver is expected to hold a high voltage (e.g., dozens of Volts) in the off state of the driver. The high voltage is a blocking voltage that can be applied for programming of selected portions of the memory array. Reference to holding the high voltage refers to being able to have the voltage potential from the drain to source without resulting in a reverse-bias breakdown that can cause a buildup of carriers under the gate oxide, which can result in punching through the gate oxide. It will be understood that reducing the conductivity of the channel and extending the channel length can have a positive impact on the ability to hold a high voltage. However, reducing the conductivity would result in lower on-state current and increase the on-state resistance. The ideal string driver would have little to no on-state resistance.

The tradeoff between high blocking voltage for the off-state and low drain-to-source resistance for the on-state traditionally prevents the use of polysilicon (poly-Si, or simply "poly") as a candidate material for the channel. Other thin film materials in addition to polysilicon could also be candidate materials for the channel. For example, doped metal oxide films could be used. More specifically, zinc oxide (ZnO), cadmium oxide (CdO), indium oxide (InO), or other conductive metal oxides can be used. It will be understood that the ratios of metal atoms to oxygen atoms is not specified in the names, and different oxide compounds could be used that could include different ratios of metal to oxygen atoms. In one example, the metal oxide can be conductive due doping, similar to the doping of semiconductor materials to tune conductivity. Dopants can include aluminum, gallium, indium, or other dopant material to cause the metal oxide to be conductive. Descriptions herein focus on examples with polysilicon for the channel conductor in the vertical channel. The descriptions will be understood to apply to the use of conductive metal oxides for the channel conductor as well as polysilicon. For purposes of simplicity, descriptions may only mention polysilicon, and will be understood to not be so limited.

A field management structure in the vertical string driver (VSD) can eliminate local high electric fields around the gate corner of the thin film transistor. In one example, the field management structure can be referred to as a super junction or an extended gate junction. The super junction can spread the electric field (e-field) in the channel to reduce or eliminate the peak at the corner of the gate.

The reduction of the electric field around the gate interface to the channel can be thought of as similar to a RESURF (reduced surface field) architecture for traditional 2D (two dimensional) transistor design. 2D transistors include a "surface" at the top of the transistor channel. 2D high voltage transistor design can include a RESURF architecture to reduce voltage at the surface of the channel. The architecture of vertical channels and the traditional 2D channels are different, and thus, traditional RESURF architectures would not apply to the vertical channel. However, the field management structure can achieve a similar "RESURF" effect in that the electric field near the gate interface can be reduced.

Thus, the field management structure can allow the adoption of poly-Si as the channel material. The field management structure design can improve the breakdown voltage (BV) by eliminating the local high electric field around the gate corner of the thin film transistor. Thus, the vertical string driver can achieve high blocking voltage in the off state while providing good conduction resistance in the on state. Calibrated simulations suggest improvement of the breakdown voltage by over 3 times relative to a similar design without the field management structure. In addition to the 3× improvement of the BV, the simulated device provided enhanced driver current relative to the same design without the field management structure.

With such field management, a vertical string driver can provide the desired perform parameters, enabling deployment of a VSD above the memory array instead of using horizontal string drivers buried under the memory array. Such a VSD would be scalable with the scaling of the memory array for horizontal feature-size reduction, which saves die area. The periphery circuitry for the memory array can be scaled down instead of limiting the scaling of the memory device chip area.

In one example, the super junction is a gate like junction structure along the conductor of the vertical channel. Thus, the super junction structure can be considered a vertical structure or vertical junction structure parallel to the vertical channel. In one example, the channel is a doped hollow channel (DHC). In one example, the super junction is a relatively low doped structure, relative to the higher doping of the gate conductor. In one example, the extended junction structure increases the e-field in the entire channel that interfaces with the structure. Increasing the overall electrical field reduces e-field peaks, which can increase BV and improve driver current.

FIG. 1 is a representation of an example of a cross section of a circuit with a stacked memory having a staircase region with vertical string drivers having an extended gate junction structure. Circuit 100 represents a cross-section of a portion of a memory device having a staircase region of a nonvolatile (NV) memory. In one example, circuit 100 represents a portion of a 3D NAND memory, such as a 3D NAND flash device. In one example, the vertical string drivers in circuit 100 could be applied to a 3DXP (3D crosspoint) memory or other stacked memory. It will be understood that certain features in circuit 100 are not necessarily drawn to scale. Rather, certain features are emphasized while others are de-emphasized.

Circuit 100 includes substrate 110, which represents a semiconductor surface on which the 3D memory structure is built. In one example, circuit 100 includes an isolation layer, such as isolation 120. Isolation 120 can represent an oxide layer (e.g., silicon dioxide ($SO_2$)) or a nitride layer that provide electrical isolation of the substrate from the electrical conductor of source 130. Source 130 can represent a metal conductor, or a poly-Si material doped to a desired conductivity. Source 130 represents a source conductor for current to flow through the vertical channels of circuit 100.

In one example, circuit 100 includes another isolation layer (not specifically labeled) between source 130 and a select gate. In one example, for a 3D structure, circuit 100 includes a select gate source layer SGS 132, or equivalent. Additionally, circuit 100 can include a select gate drain layer SGD 134 as a drain for the memory layers.

The memory structures are formed in the layers between SGS 132 and SGD 134 in the layers of wordlines (WL) 140. The number of layers of WL 140 can be different for different memory devices. Layers of WL 140 form a 3D stack of bitcells or storage cells. In general, the wordlines are activated in response to a row address for a memory access operation (e.g., read or write). WL 140 can be vertically stacked in a staircase pattern having connections to WL 140 exposed for connection to conductor pillars 162.

Circuit 100 includes bitlines (BL) 150 that are charged in response to a column address for the memory access operation. WL 140 connect to multiple rows of bitcells, and BL 150 select individual bits or bitcells of the selected row or rows. The orientation of the stack of WL 140 can vary based on perspective. For example, the wordline at the top of the stack or top layer of the stack can be considered a first wordline near an edge of staircase region 142. In one example, the wordline at the bottom of the stack or bottom layer of the stack can be considered the first wordline in staircase 142.

As illustrated, BL 150 go into the page in circuit 100 and WL 140 go from left to right on the page. BL 150 and WL 140 are orthogonal to each other. In one example, the bitcells are at the intersection of a BL and a WL. In one example, BL 150 has vertical columns or channels through layers of WL 140. In one example, a NV media includes a bitcell at an overlap of a bitline and a wordline.

Staircase 142 illustrates the staircase structure of circuit 100. The staircase structure can be identified as a staircase stack, and refers to the fact that from a cross-section view, using substrate 110 as a reference "floor", a wordline layer above another wordline layer will not extend as far as the one below it. Thus, the wordline layers at the edge appear to have steps up from the wordline closest to substrate 110 to the wordline farthest away from substrate 110.

Staircase 142 represents a region that exposes the various wordlines for vertical connection to connector layer 160. Connector 160 represents a conductive line in a layer that allows electrical access to circuit 100 from external I/O (input/output) for a device in which circuit 100 will be incorporated. In one example, connector 160 represents multiple parallel conductive lines that extend from left to right in the orientation of FIG. 1. The connector lines can be parallel with WLs 140, and orthogonal to BLs 150.

Staircase 142 represents a stepped region of the layers of WL 140, in which the rows extend out further in the lower levels of the stack to make contact with vertical connectors or vertical pillars 162. Vertical pillars 162 connect wordlines to connector 160. Connectors 160 connect the wordlines to external contacts for the memory chip of circuit 100. Connector layer 160 can also be referred to as an access layer or contact, and is located at or near a top layer of circuit 100. Connector 160 provides a connection point for external I/O.

In one example, circuit 100 includes vertical string drivers (VSD) 170. More specifically, the vertical string drivers are illustrated as SJ VSD, or super junction VSDs. The super junction refers to a field management structure within VSDs 170. In one example, VSD 170 is triggered by gate 172. Gate 172 represents a gate to control the on state and the off state of VSD 170. In turn, VSD 170 controls the flow of current through connection pillars 162. Control of current flow through pillars 162 controls the charging of WL 140.

SJ VSD 170 are located at the top of the pillars that connect to staircase 142. In one example, the location of VSD 170 at the top of the staircase enables scaling down the periphery area. Circuit 100 can represent a NAND device with a vertical string driver for a NAND string. In general, circuit 100 represents a device with a vertical string driver for any technology that applies a polysilicon thin film high voltage device.

Figure 2:
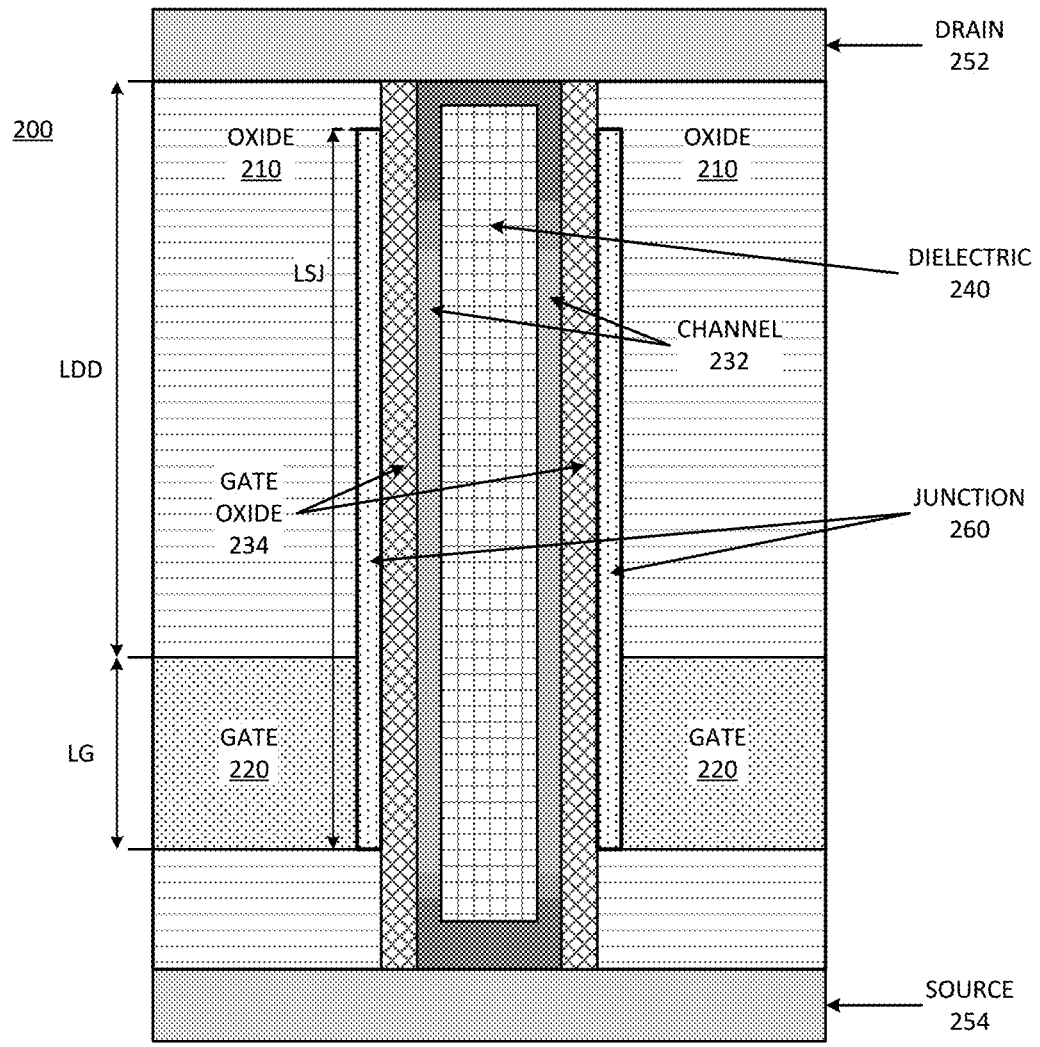
FIG. 2 is a representation of an example of a cross section of a vertical string driver with a gate-connected junction.

FIG. 2 is a representation of an example of a cross section of a vertical string driver with a gate-connected junction. Circuit 200 provides an example of a vertical string driver in accordance with VSD 170 of FIG. 1. Circuit 200 represents a cross section view of the vertical string driver circuit.

In one example, circuit includes gate 220, which is the gate to control conduction of the string driver. The string driver of circuit 200 provides conduction between source 254 and drain 252. In one example, source 254 connects circuit 200 to a vertical pillar. In one example, drain 252 connects circuit 200 to a connector that is to drive the vertical connector.

In one example, circuit 200 includes oxide 210 as an isolation layer between gate 220 and source 254, as well as between gate 220 and drain 252. In one example, circuit 200 can include a nitride as an isolation layer in the alternative to oxide 210. From one perspective, gate 220 is vertically separated from source 254 by an electrical isolation layer, which could be referred to as a first electrical isolation layer. Gate 220 is vertically separated from drain 252 by an electrical isolation layer, which could be referred to as a second electrical isolation layer.

In one example, source 254 is a metal or a highly doped N-type (N+) polysilicon. In one example, drain 252 is a metal or a highly doped N+ polysilicon. N-type polysilicon refers to polysilicon that is doped with a material to cause electrons to be the majority carriers of current when the material conducts current. N-type poly is different from P-type poly, which refers to a material doped with other materials to cause holes to be the majority carriers of current when the material conducts current. In one example, either source 254, or drain 252, or both source 254 and drain 252 include multiple layers, such as a metal and a layer of polysilicon (e.g., highly doped N+ material). It will be understood that metal is a material that inherently has electron-dominant carriers.

A highly doped material (N+ for N-type material, and P+ for P-type material) refers to a poly material that has a relatively high percentage of dopant to result in a relatively high number of carriers. A low doped material (N− for N-type material, and P− for P-type material) refers to a poly material that has a relatively low percentage of dopant to result in a relatively low number of carriers. It will be understood that "highly doped" and "low doped" are relative terms that will be different for different implementations. The amount of doping that results in high doping or low doping can depend on the amount of current that will be conducted, as well as the desired resistance. In general, the terms make reference to the fact that certain materials have different doping levels relative to each other in the same circuit.

In one example, channel 232 is a highly doped N+ poly channel. In one example, drain 252 and source 254 are either metal or a higher doped poly than channel 232. Thus, at the junction of channel 232 with drain 252 and at the junction of channel 232 with source 254, the channel can have higher doping due to diffusion of carriers from the drain and source, respectively. Such an implementation is illustrated in circuit 200 by the darker shading of channel 232 at the junction regions. The junction regions are where channel 232 is electrically connected to drain 252 and source 254.

In one example, channel 232 is a "hollow channel," with doped polysilicon as a conductive channel, surrounding dielectric 240. In one example, dielectric 240 is oxide, which could be the same oxide as oxide 210. Channel 232 is represented in an idealized state, with straight channel walls and symmetric size from drain 252 to source 254. In a practical implementation, it will be understood that channel 232 may have tapering, having a wider width near drain 252 than the width near source 254.

In one example, channel 232 includes gate oxide 234. Gate oxide 234 may also be the same material as oxide 210 and dielectric 240. Whether or not gate oxide 234, oxide 210, and dielectric 240 are the same material, they are represented with different shading to represent the fact that they are created at different steps of processing of circuit 200.

In one example, gate 220 is a polysilicon material. In one example, gate 220 is a high doped P+ poly gate. It will be understood that the concentration of dopant for N+ material is not necessarily the same as the concentration of dopant for P+ material, although it may be. Junction 260 represents a field management structure electrically coupled to gate 220. Typically, if gate 220 is a p-type material, junction 260 will also be a p-type material. In one example, junction 260 is lighter doped (e.g., P−) than gate 220 (e.g., P+).

Circuit 200 illustrates gate 220 having a height (or a vertical length) of LG, which is the length of the gate. Oxide 210 between gate 220 and drain 252 has a vertical length of LDD, or the length of the drain region. LDD can be considered the drain regions or the length of the drift region or drift space for channel 232. The drift region refers to the length of channel 232 between gate 220 and drain 252, which allows the accumulation of charge to allow circuit 200 to operate in high voltage conditions or to withstand a high voltage differential between source 254 and drain 252.

In one example, the vertical length or the height of junction 260 (LSJ) is much greater than LG or the height of gate 220. Junction 260 is illustrated in circuit 200 to extend from the bottom of gate 220 almost to drain 252. The height of junction 260 can be different depending on the doping and the desired field spreading for circuit 200.

Junction 260 provides a physical structure to affect the electrical field or electric field in the polysilicon of channel 232. More specifically, junction 260 can reduce field peaks in vertical channel 232 when the gate conductor of gate 220 is not biased. Gate 220 is not biased when the string driver is in the off state, where no bias voltage or bias current is applied to gate 220. In one example, junction 260 reduces electric field peaks in channel 232 caused at the corner of gate 220.

Junction 260 can be referred to as a super junction structure. In one example, the combination of junction 260 and gate 220 can extend the conductivity of gate 220 along channel 232 toward drain 252. The extension of junction 260 along channel 232 will cause a distribution of the electric field in channel 232 when the string driver is in an off state. The off state can be considered the state when a voltage differential exists between source 254 and drain 252 and gate 220 is not charged with a bias current. It will be understood that regardless of LG, or the length of gate 220, the corners of gate 220 will cause a high electric field when there is a high voltage differential between drain 252 and source 254. Thus, even making the layer of material for gate 220 thicker would not remove the high voltage field at the corners.

Junction 260 can distribute the electric field along more length of channel 232, reducing the field strength at the corners of gate 220. The distribution of the electric field by junction 260 results in a significantly higher breakdown voltage relative to a comparable circuit that has only gate 220. In one example, junction 260 surrounds the channel in the depletion region of the string driver transistor.

It will be understood that the cross section view of circuit 200 shows a rectangular cross section for channel 232. The channel can be cylindrical or other shape, as described in more detail below. Reference to the shape of the channel can refer to a shape of the channel itself or of a top view of the channel. Whatever the shape of channel 232, junction 260 can provide a field distribution structure all around the thin film transistor that is used as a string driver. The thin film transistor refers to the transistor formed by the thin films of gate oxide 234 and the conductor of channel 232, to create the channel between drain 252 and source 254 to be selectively driven by application of a bias current or bias voltage on gate 220.

In accordance with what is described above, circuit 200 can have a similar effect to a RESURF effect for a horizontal, planar transistor. The distribution of the e-field in the channel by junction 260 can operate to deplete the drift region. Depletion of the drift region reduces the electric field on the thin poly film of channel 232. In effect, the spreading of the electric field can extend the depletion region in the reverse bias application, which can increase the breakdown voltage.

Channel 232 can be referred to as a vertical channel. Channel 232 intersects the conductor of gate 220. Channel 232 can be designed to be orthogonal to gate 220 or approximately orthogonal, allowing for processing variance. It can be observed that junction 260 rises into oxide 210 in a manner parallel to channel 232 and to gate oxide 234 which separates the conductor of channel 232 from the conductor of gate 220.

In one example, gate oxide 234 is thicker than a gate oxide would be in vertical string driver structure that does not have a super junction structure. The thicker gate can provide a greater voltage barrier for gate 220 to channel 232. The distribution of the electric field in channel 232 can cause the channel to conduct more easily relative to a traditional gate structure, which can be balanced by the thicker gate oxide. In one example, junction 260 is a p-type poly structure in parallel with an N+ doped poly channel 232, separated by gate oxide 234.

Figure 3:
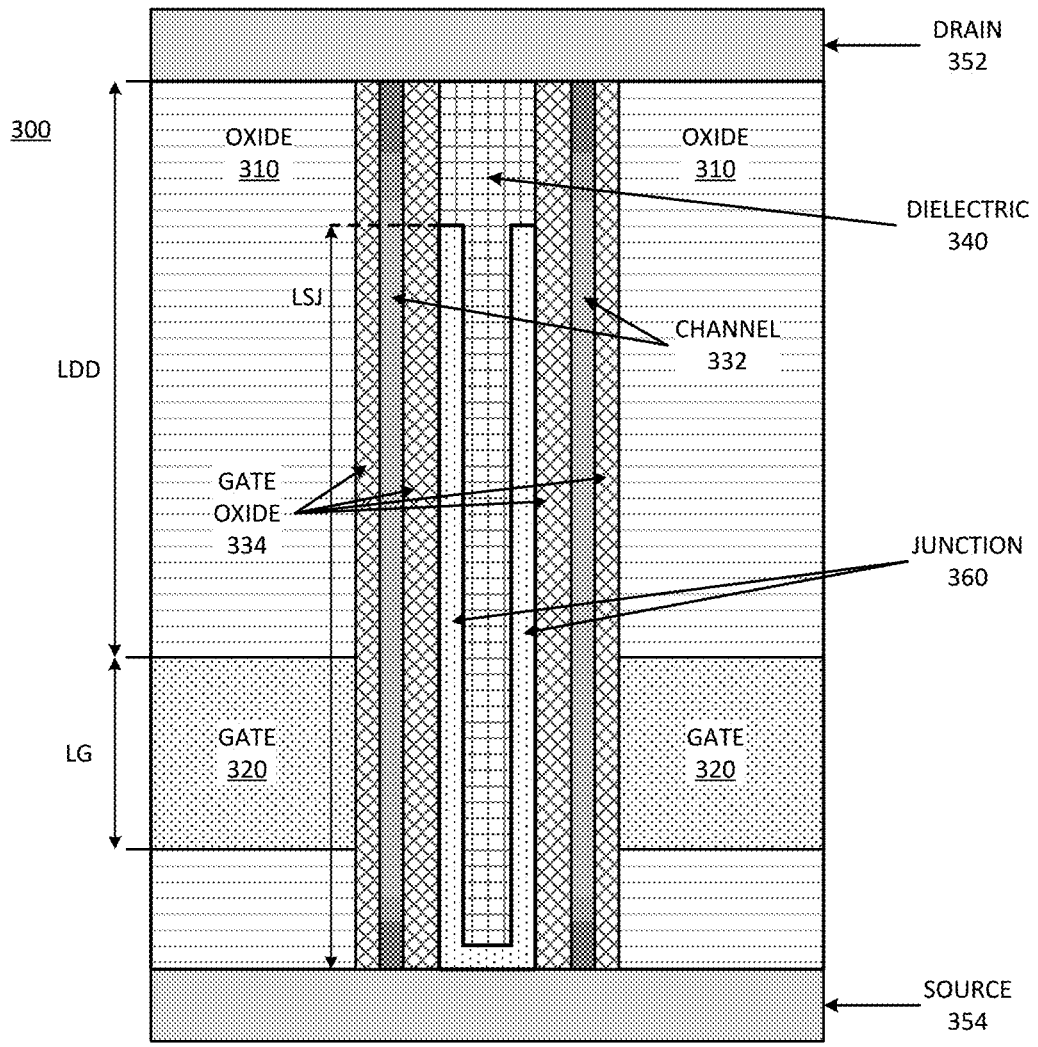
FIG. 3 is a representation of an example of a cross section of a vertical string driver with a source-connected junction.

FIG. 3 is a representation of an example of a cross section of a vertical string driver with a source-connected junction. Circuit 300 provides an example of a vertical string driver in accordance with VSD 170 of FIG. 1. Circuit 300 represents a cross section view of the vertical string driver circuit. Like circuit 200 of FIG. 2, circuit 300 includes a field management structure super junction. The super junction of circuit 300 is electrically connected to the source conductor instead of to the gate conductor.

The descriptions of circuit 200 of FIG. 2 can apply to comparable elements of circuit 300 of FIG. 3. More specifically, the descriptions of oxide 210 can apply to oxide 310, the descriptions of gate 220 can apply to gate 320, the descriptions of channel 232 can apply to channel 332, the descriptions of gate oxide 234 can apply to gate oxide 334, the descriptions of dielectric 240 can apply to dielectric 340, the descriptions of drain 252 can apply to drain 352, and the descriptions of source 254 can apply to source 354. General descriptions of the functions and effects of junction 260 can also apply to junction 360.

In one example, the vertical length or the height of junction 360 (LSJ) is much greater than LG or the height of gate 320. Junction 360 is illustrated in circuit 300 to extend from source 354 to close to drain 352. The height of junction 360 can be different depending on the doping and the desired field spreading for circuit 300.

Junction 360 provides a physical structure to affect the electrical field or electric field in the polysilicon of channel 332. More specifically, junction 360 can reduce electrical field peaks in vertical channel 332 when the gate conductor of gate 320 is not biased. Gate 320 is not biased when the string driver is in the off state, where no bias voltage or bias current is applied to gate 320. In one example, junction 360 reduces electric field peaks in channel 332 caused at the corner of gate 320.

Junction 360 can be referred to as a super junction structure. Junction 360 is electrically connected to source 354 and extends a length of channel 332 greater than the length of the direct interface of gate 320 with channel 332 (the interface being through gate oxide 334). In one example, junction 360 can extend the conductivity of charge along channel 332 toward drain 352. The extension of junction 360 along channel 332 will cause a distribution of the electric field in channel 332 when the string driver is in an off state. The off state can be considered the state when a voltage differential exists between source 354 and drain 352 and gate 320 is not charged with a bias current. It will be understood that regardless of LG, or the length of gate 320, the corners of gate 320 will cause a high electric field when there is a high voltage differential between drain 352 and source 354. Thus, even making the layer of material for gate 320 thicker would not remove the high voltage field at the corners.

Junction 360 can distribute the electric field along more length of channel 332, reducing the field strength at the corners of gate 320. The distribution of the electric field by junction 360 results in a significantly higher breakdown voltage relative to a comparable circuit that has only gate 320. In one example, junction 360 surrounds the channel in the depletion region of the string driver transistor. Where junction 260 of FIG. 2 extends the depletion region by field management on the gate side of the channel conductor of channel 232, junction 360 extends the depletion region by field management on the dielectric side of the channel conductor of channel 332.

It will be understood that the cross section view of circuit 300 shows a rectangular cross section for channel 332. The channel can be cylindrical or other shape, as described in more detail below. Reference to the shape of the channel can refer to a shape of the channel itself or of a top view of the channel. Whatever the shape of channel 332, junction 360 can provide a field distribution structure from within the thin film transistor that is used as a string driver. The thin film transistor refers to the transistor formed by the thin films of gate oxide 334 and the conductor of channel 332, to create the channel between drain 352 and source 354 to be selectively driven by application of a bias current or bias voltage on gate 320. The string transistor of circuit 300 can further include the extended gate structure that has gate-like material that extends from source 354 toward drain 352.

In accordance with what is described above, circuit 300 can have a similar effect to a RESURF effect for a horizontal, planar transistor. The distribution of the e-field in the channel by junction 360 can operate to deplete the drift region. Depletion of the drift region reduces the electric field on the thin poly film of channel 332. In effect, the spreading of the electric field can extend the depletion region in the reverse bias application, which can increase the breakdown voltage.

In one example, the channel includes an additional gate oxide region between the conductor of channel 332 and junction 360. The additional gate oxide can be thicker than a gate oxide would be in vertical string driver structure that does not have a super junction structure. The thicker gate can provide a greater voltage barrier for the depletion region induced in the channel by junction 360. The distribution of the electric field in channel 332 can cause the channel to conduct more easily relative to a traditional gate structure, which can be balanced by the thicker gate oxide. In one example, junction 360 is a p-type poly structure in parallel with an N+ doped poly channel 332, separated by the additional oxide portion. In one example, gate oxide 334 and dielectric 340 are the same or similar material. The oxide may be considered different when processed on different structures.

Figure 4:
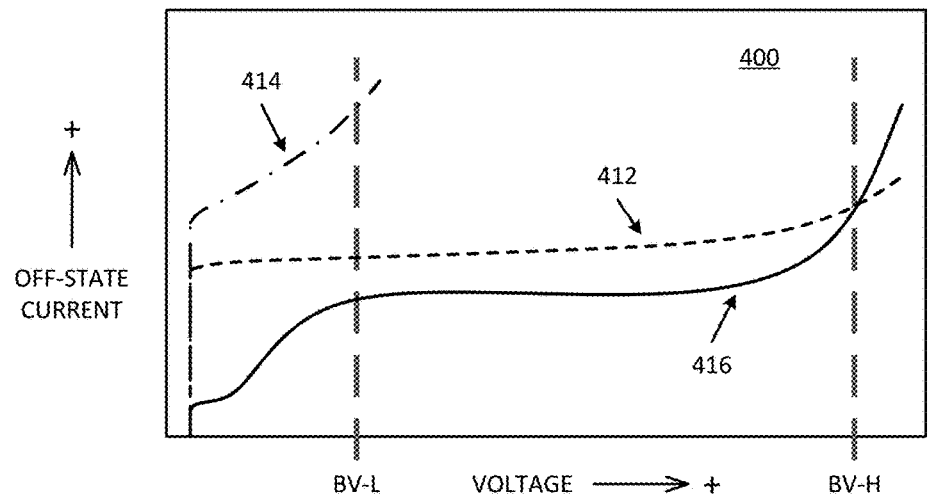
FIG. 4 is a diagrammatic representation of an example of the current response in the off-state of a vertical string driver with an extended junction structure.

FIG. 4 is a diagrammatic representation of an example of the current response of a vertical string driver with an extended junction structure. Diagram 400 illustrates three curves mapped as off-state current versus voltage differential between drain and source. Voltage increases in the direction of the arrow pointing to the '+' sign. Off-state current increase in the direction of the arrow pointing to the '+' sign.

The specific values of current and voltage are not illustrated in diagram 400, which simply provides the general form of curves for different simulated scenarios as described in more detail below. In one example, the current is plotted on a logarithmic axis rather than a linear axis. The general form of the curves illustrates the improvement provided by the field management structures.

Curve 412 is a dashed line, and represents a current response of a traditional horizontal string driver. The thick dashed line labeled "BV-H" represents a high voltage breakdown voltage, which could, for example, be in excess of 20 V. It can be observed that curve 412 has a breakdown voltage in at the dashed line of BV-H.

Curve 414 is a dashed-dotted line, and represents a current response of a traditional vertical string driver with a poly channel. It can be observed that the breakdown voltage for curve 414 is BV-L, which represents a low breakdown voltage. For example, BV-H could be three or four times higher than BV-L.

Curve 416 is the solid line, an represents a current response for a vertical string driver with a poly channel having a gate with a field management structure. It can be observed that the breakdown voltage for curve 416 may be a little bit lower than BV-H, but is still significantly higher than BV-L. Thus, the field management structure provides a significant improvement in the BV for the vertical string driver, and gives the vertical string driver a similar performance as a traditional horizontal string driver. Calibrated simulation has demonstrated a 3× improvement in BV between a vertical string driver with a field management structure and a vertical string driver without one.

Figure 5A:
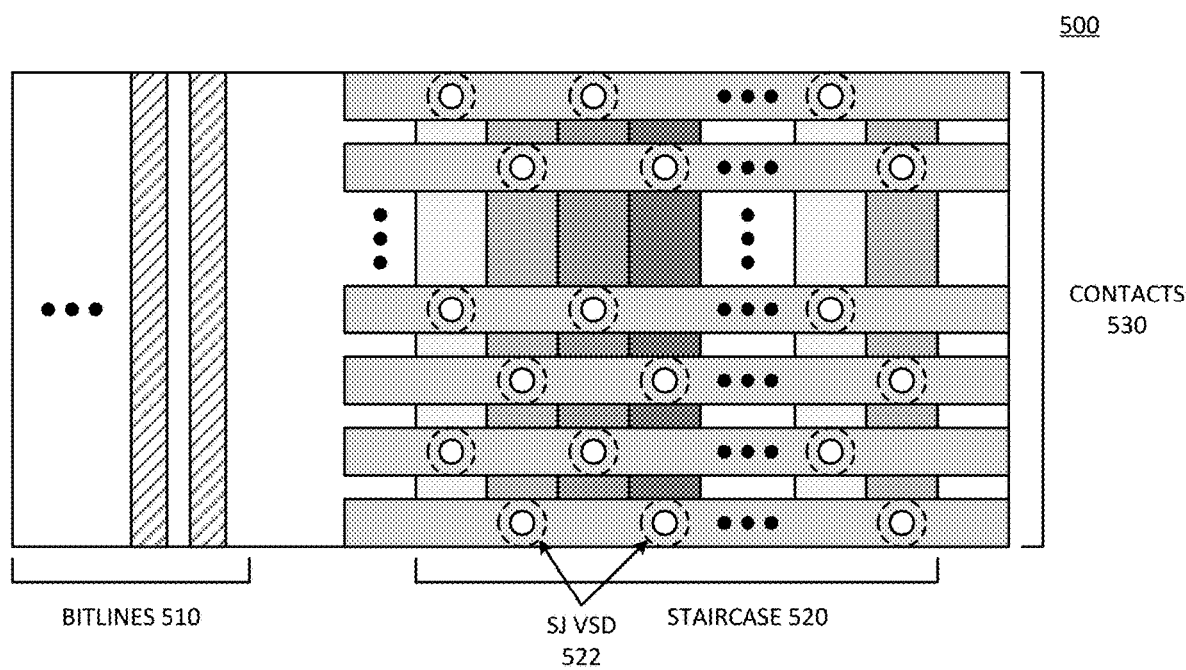
FIG. 5A is a representation of an example of a top view of a circuit with vertical string drivers.

FIG. 5A is a representation of an example of a top view of a circuit with vertical string drivers. Diagram 500 illustrates a top view of an example of a circuit in accordance with circuit 100 of FIG. 1. Diagram 500 can be considered layout of circuit features for the staircase region of a memory device, in an implementation of vertical string drivers for a memory device.

The top view illustrates the orientation of the different portions of the circuit. In diagram 500, bitlines 510 run up and down in the orientation of the figure. Contacts 530 run right to left, orthogonal to bitlines 510. The wordlines are not specifically shown, but would be parallel to contacts 530, and could run under them. Contacts 530 can represent connectors that connect to active wordlines. Additionally, the gates to control the VSDs are not specifically illustrated in diagram 500, but would also run under contacts 530 to intersect with SJ VSDs 522.

Rather than specifically showing the wordlines, diagram 500 illustrates staircase 520 with different shading to represent different levels of the staircase region. In diagram 500, the channels of the vertical string drivers are represented as solid circles on the contact conductive lines, while the dashed circles represent the vertical string drivers themselves. SJ VSD 522 represents the super junction or extended gate junction structures of the vertical string drivers, or VSDs with super junction structures as field management structures.

Figure 5B:
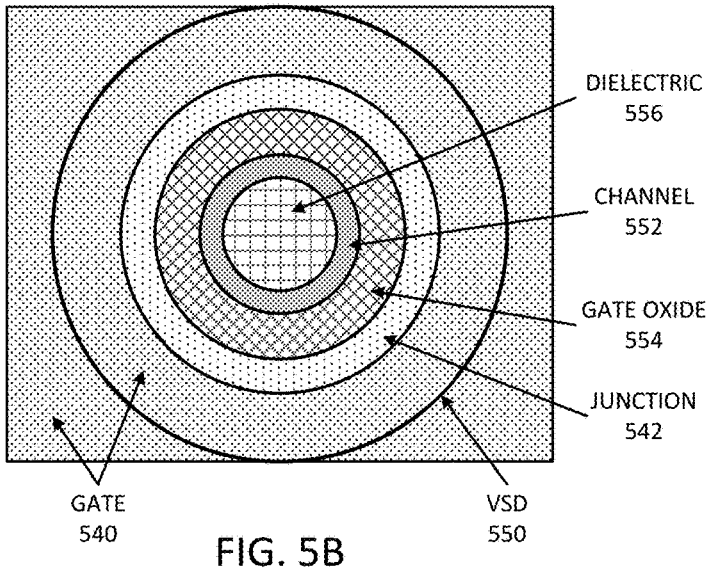
FIG. 5B is a representation of an example of a top view of a vertical string driver with a gate connected junction structure.

FIG. 5B is a representation of an example of a top view of a vertical string driver with a gate connected junction structure. VSD 550 represents a vertical string driver in a cylindrical architecture of the VSD. Gate 540 represents a gate such as gate 172 of FIG. 1. Gate 540 will be understood to pass under the other layers illustrated.

Gate oxide 554 represents a gate oxide for the operation of the transistor of VSD 550. Channel 552 represents the channel conductor. Dielectric 556 represents the dielectric that is surrounded by channel 552. VSD 550 includes junction 542, which is a field management structure in accordance with any description herein of a gate connected junction. In one example, junction 542 is located adjacent to gate oxide 554, extending in parallel with channel 552.

Figure 5D:
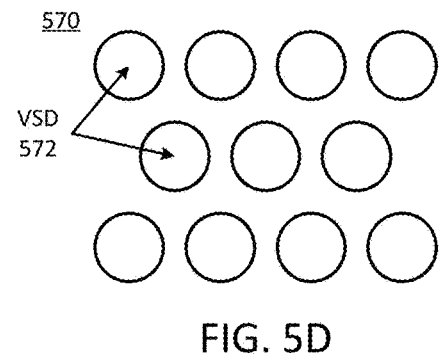
FIG. 5D is a representation of an example of a layout of vertical string drivers with a cylindrical profile.
Figure 5C:
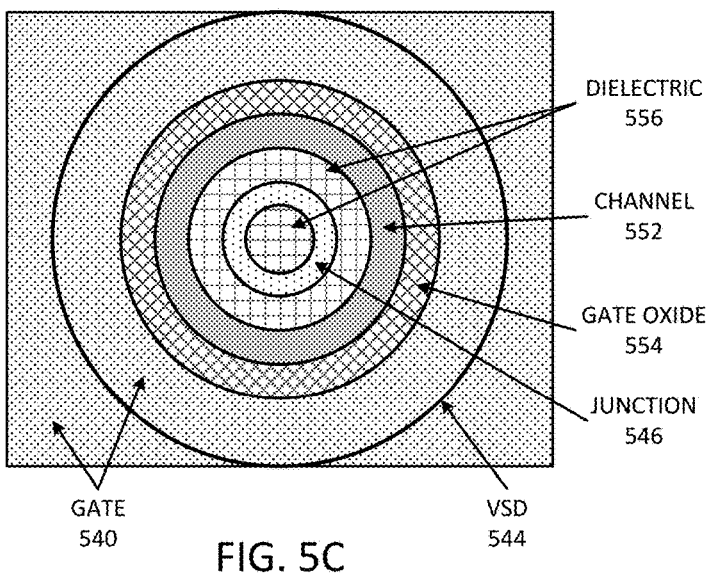
FIG. 5C is a representation of an example of a top view of a vertical string driver with a source connected junction structure.

FIG. 5C is a representation of an example of a top view of a vertical string driver with a source connected junction structure. VSD 544 represents a vertical string driver in a cylindrical architecture of the VSD. Gate 540 represents a gate such as gate 172 of FIG. 1. Gate 540 will be understood to pass under the other layers illustrated.

Gate oxide 554 represents a gate oxide for the operation of the transistor of VSD 550. Channel 552 represents the channel conductor. Dielectric 556 represents the dielectric that is surrounded by channel 552.

VSD 544 includes junction 546, which is a field management structure in accordance with any description herein of a source connected junction. In one example, junction 546 is located inside channel 552, surrounded by dielectric 556, extending in parallel with channel 552. In one example, what is shown as an additional film of dielectric 556 between channel 552 and junction 546 is another film of gate oxide, to the extent that the gate oxide is different from dielectric 556.

FIG. 5D is a representation of an example of a layout of vertical string drivers with a cylindrical profile. Diagram 570 illustrates an example of an offset pattern of VSDs 572 with cylindrical profiles. There could be VSDs lined up in rows and columns, instead of having rows of offset columns as illustrated. It will be understood that the pattern of diagram 570 provides a denser pattern of string drivers. It will be observed that as the processing of vertical channels scales down (for vertical channels not illustrated), the same process scaling could scale down the VSDs.

Figure 5E:
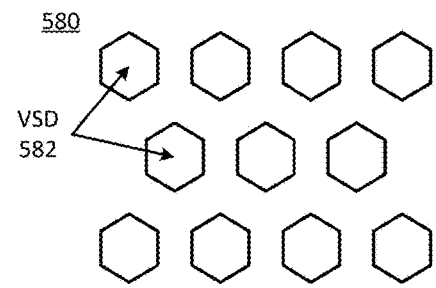
FIG. 5E is a representation of an example of a layout of vertical string drivers with a hexagonal profile.

FIG. 5E is a representation of an example of a layout of vertical string drivers with a hexagonal profile. Diagram 580 illustrates an example of an offset pattern of VSDs 582 with hexagonal profiles. Diagram 580 represents an alternative to the cylindrical profiles illustrated in diagram 570. The patterning options described with respect to diagram 570 apply to diagram 580.

Figure 5F:
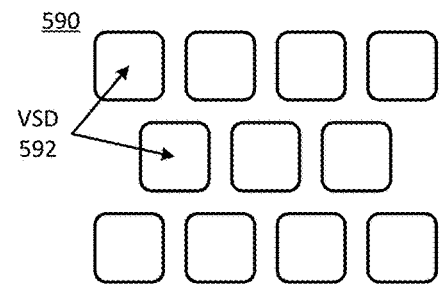
FIG. 5F is a representation of an example of a layout of vertical string drivers with a square profile.

FIG. 5F is a representation of an example of a layout of vertical string drivers with a square profile. Diagram 590 illustrates an example of an offset pattern of VSDs 592 with square profiles. Diagram 590 represents an alternative to the cylindrical profiles illustrated in diagram 570 or the hexagonal profiles of diagram 580. The patterning options described with respect to diagram 570 apply to diagram 590.

FIGS. 6A-6L are diagrammatic representations of a cross-section of stages of processing of a vertical string driver with a gate-connected junction. For purposes of example, FIGS. 6A-6L illustrate the processing to create a vertical string driver with a field management structure. The circuit states illustrated in FIGS. 6A-6L can apply to any example of a vertical string driver with a junction structure as a field management structure, such as circuit 200. As illustrated, vertical stacking can refer to any processing that extends circuit elements out or up and away from the semiconductor substrate on which the devices are processed.

Figure 6B:
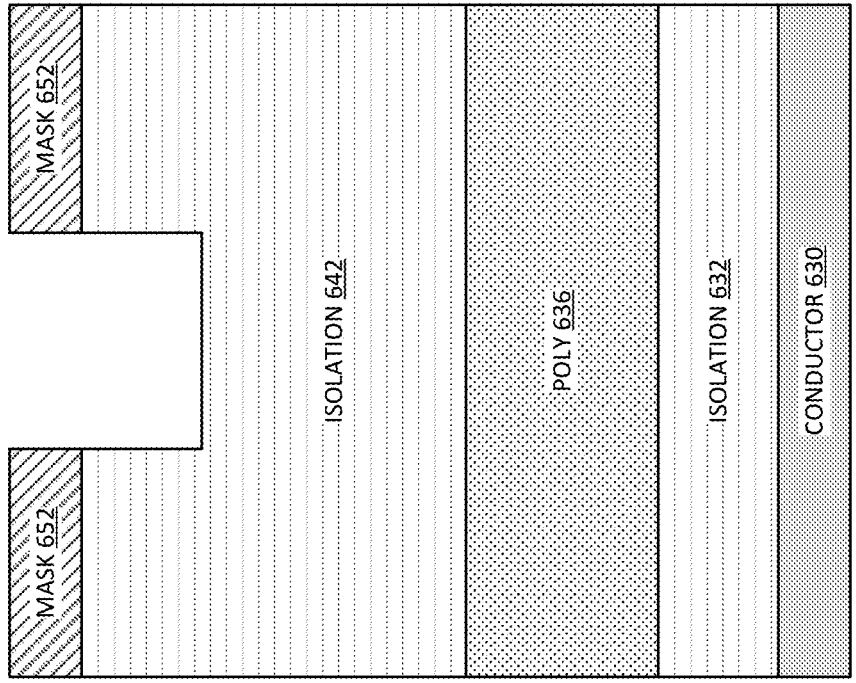
Figure 6A:
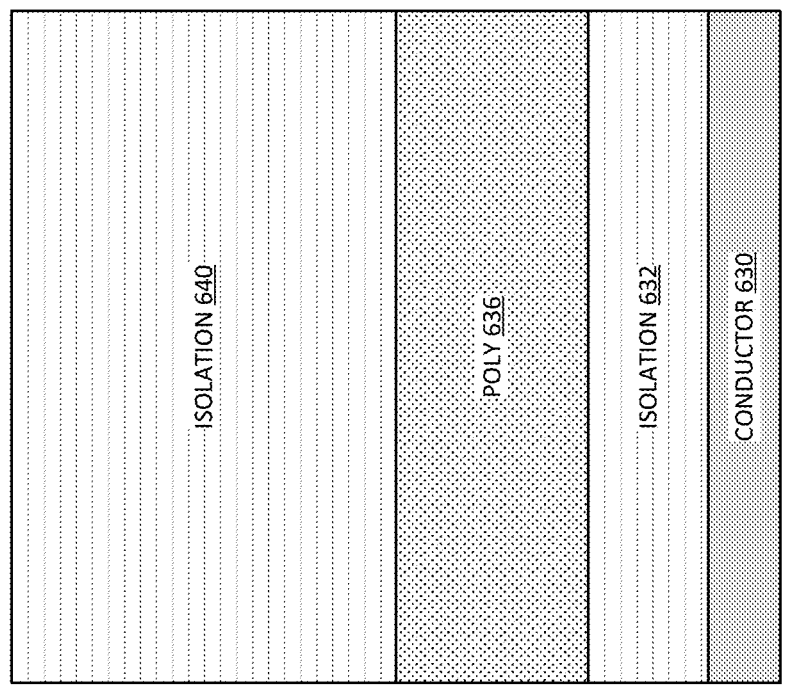

FIG. 6A illustrates circuit state 600, in which conductor 630 is processed on a semiconductor substrate (e.g., a silicon wafer). The semiconductor substrate is not specifically illustrated. Conductor 630 can be a metal or a highly doped polysilicon (e.g., N+ doped poly), or a combination of metal and poly. For example, a metal layer can be deposited, followed by a poly silicon that will provide advantages to creation of other layers or provide a stop layer for etching, or some other processing improvement.

Isolation 632 provides a separation between the conductor 630 and the doped poly material of poly 636. Poly 636 represents a poly material for a select gate that can be used to activate the operation of the vertical string driver. In one example, poly 636 is a P+ doped poly. In one example, isolation 640 is processed on poly 636. Poly 636 is for the gate, and isolation 640 provides an isolation layer between gate 636 and the drain.

FIG. 6B illustrates circuit state 602, in which the processing etches or removes a portion of isolation 640 of the initial state 600. The resulting etched isolation layer is represented as isolation 642. Mask 652 represents a lithographic mask, such as a photoresist layer. Mask 652 represents a patterned material that can shield areas not to be removed, and expose areas to be removed. In one example, the removal of material can be accomplished by dry etch.

FIG. 6C illustrates circuit state 604, in which the processing removes more material from the isolation layer, which is illustrated as isolation 644. Mask 654 allows the removal of material from the isolation layer directly on top of conductor 630 and from the poly gate layer. The resulting isolation layer structure on conductor 630 is represented as isolation 634. The resulting poly layer on isolation 634 is represented as poly 638. The resulting isolation layer on poly 634 is represented as isolation 644. In one example, the removal of material can be accomplished by dry etch.

FIG. 6D illustrates circuit state 606, in which the processing forms material in the exposed area for junction 660. The processing removes mask 654 and forms the junction material. In one example, the forming of junction 660 can be by deposition of p-type poly.

Figure 6F:
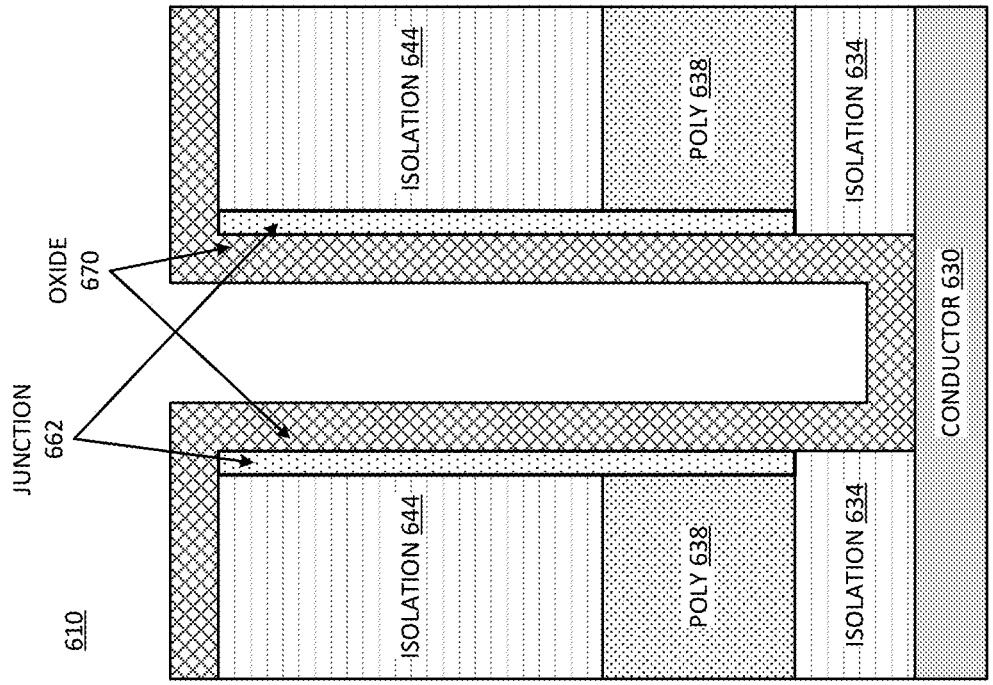
Figure 6E:
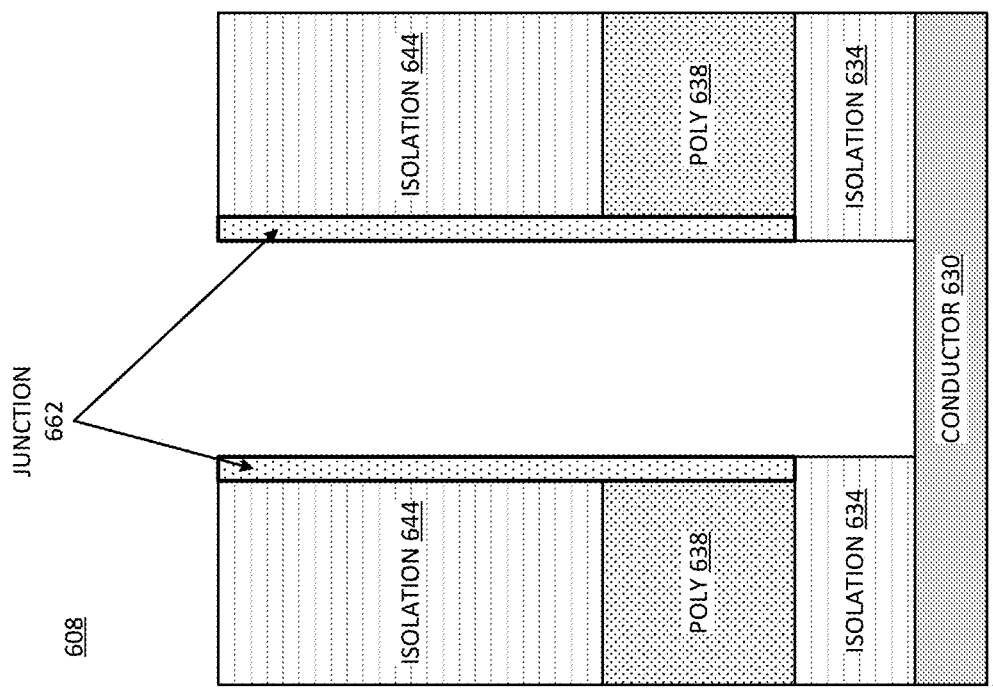

FIG. 6E illustrates circuit state 608, in which the processing can remove excess junction material. The resulting junction structure is illustrated as junction 662. In one example, the removal of the junction material can be performed by a poly silicon etch.

FIG. 6F illustrates circuit state 610, in which the processing creates oxide 670 over isolation 644, conductor 630, and over the walls of the channel pillar. In one example, isolation 634, isolation 644, and oxide 670 are the same material. In one example, instead of oxide, the processing can apply nitride for either isolation layer or for both isolation layers. In one example, the processing of oxide 670 can be performed by gate oxide deposition or thermal oxidation.

Figure 6H:
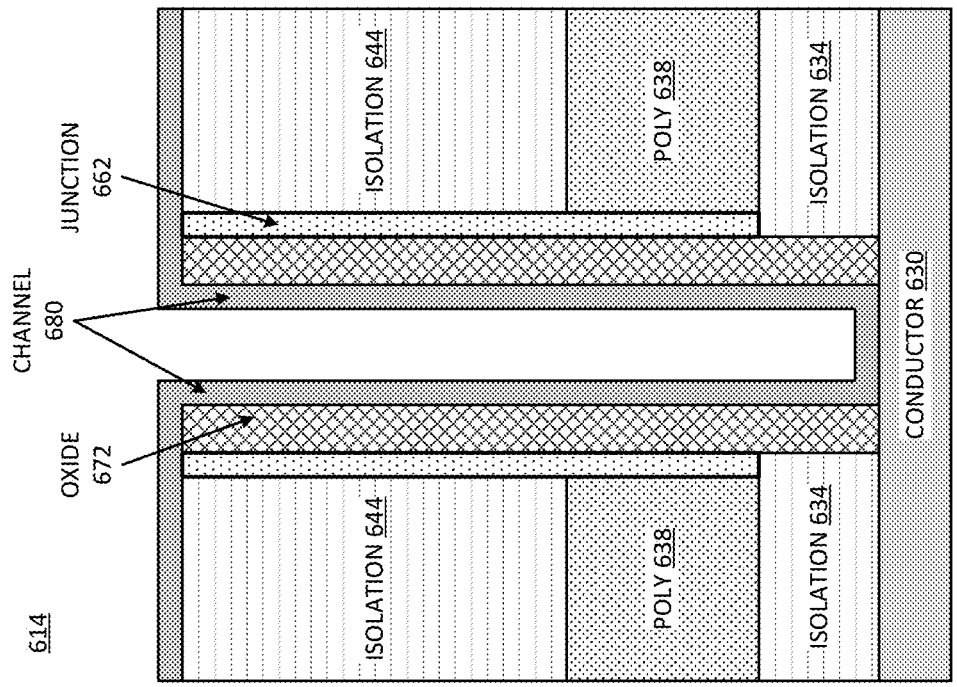
Figure 6G:
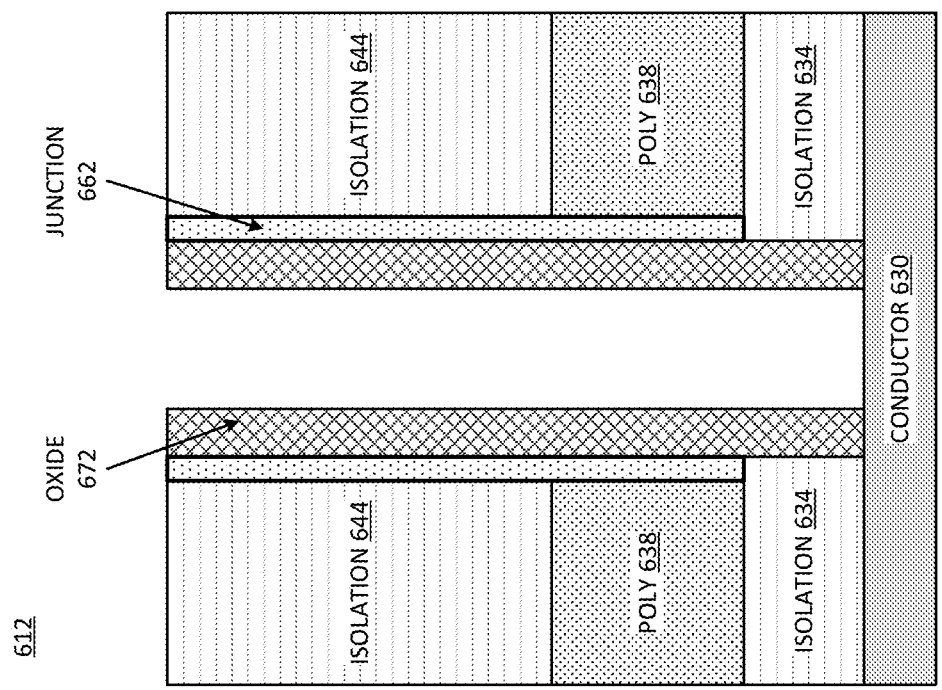

FIG. 6G illustrates circuit state 612, in which the processing removes oxide from isolation 644 and from conductor 630. The resulting structure is represented as oxide 672. In one example, the oxide can be removed by oxide etch.

FIG. 6H illustrates circuit state 614, in which the processing can form the channel conductor. The channel conductor is represented as channel 680, formed over isolation 644, the walls of oxide 672, and conductor 630. In one example, the formation of channel 680 can be performed by n-type poly deposition.

Figure 6J:
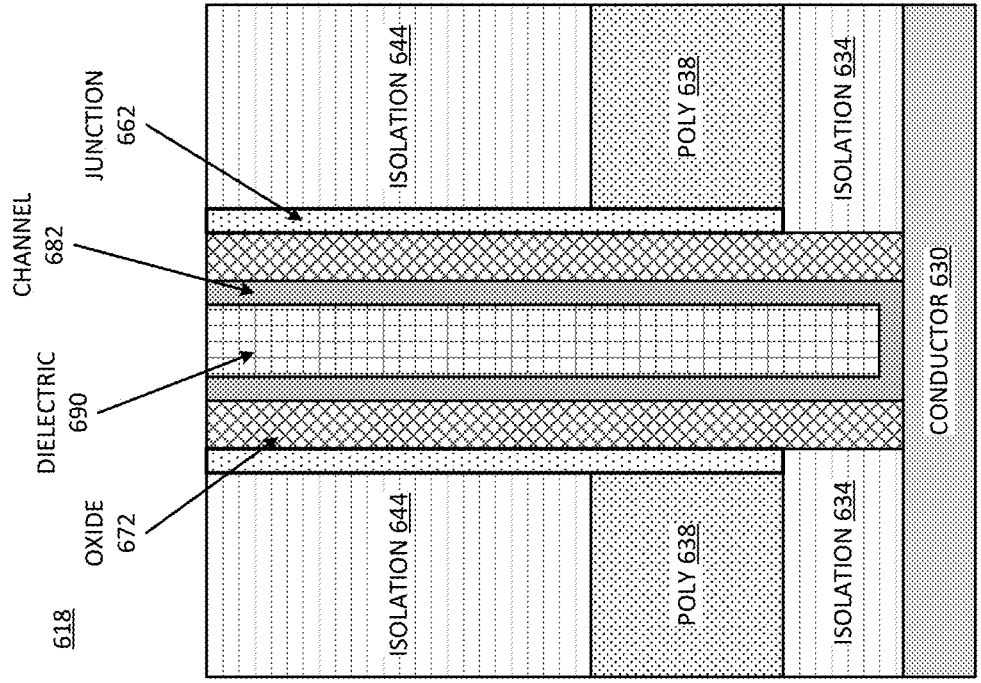
Figure 6I:
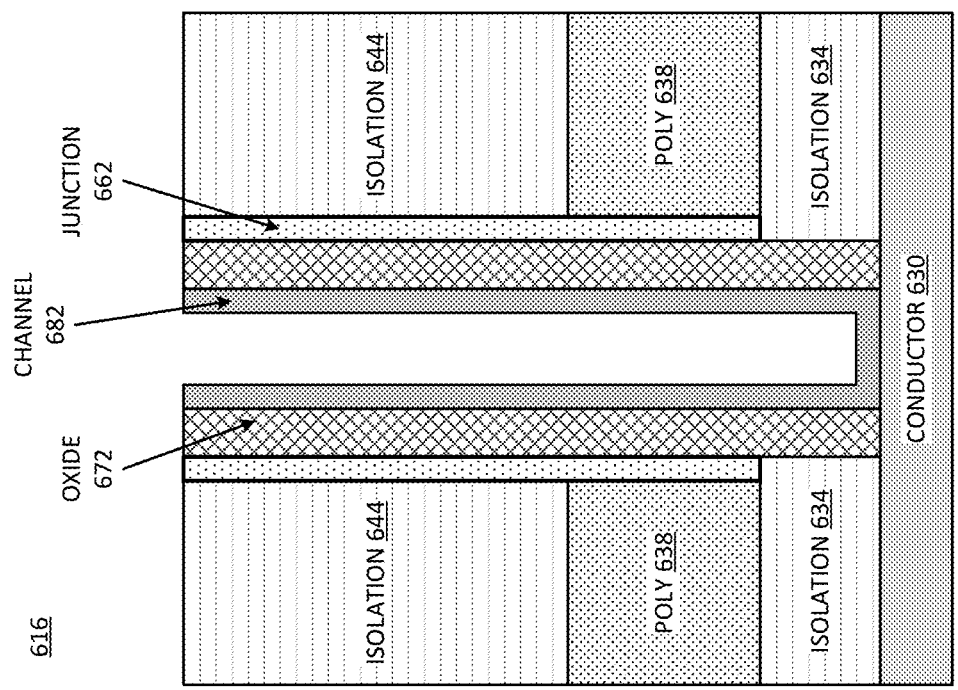

FIG. 6I illustrates circuit state 616, in which the processing can remove the channel material from the top of isolation 644, and optionally from conductor 630. In one example, the removal of the channel material does not include removal of the material from conductor 630. The resulting channel structure is represented as channel 682. In one example, the removal of the channel material can be performed by poly silicon etch.

FIG. 6J illustrates circuit state 618, in which the processing can create dielectric 690. In one example, dielectric 690 is an oxide material. In one example, the creation of dielectric 690 can be performed by oxide deposition and chemical mechanical processing (CMP) or oxide etch.

Figure 6L:
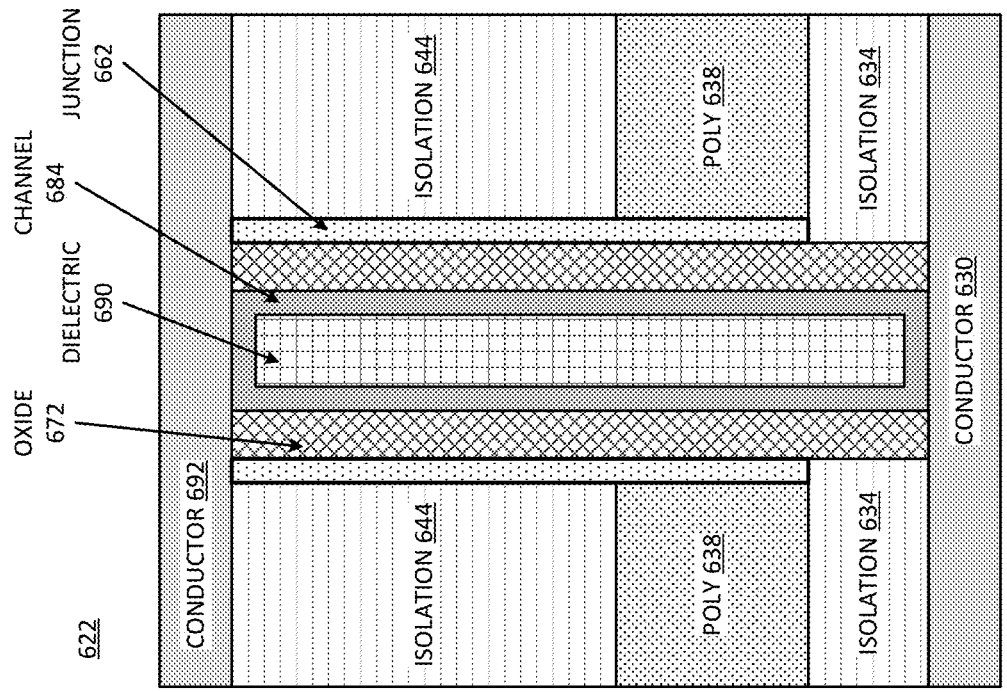
Figure 6K:
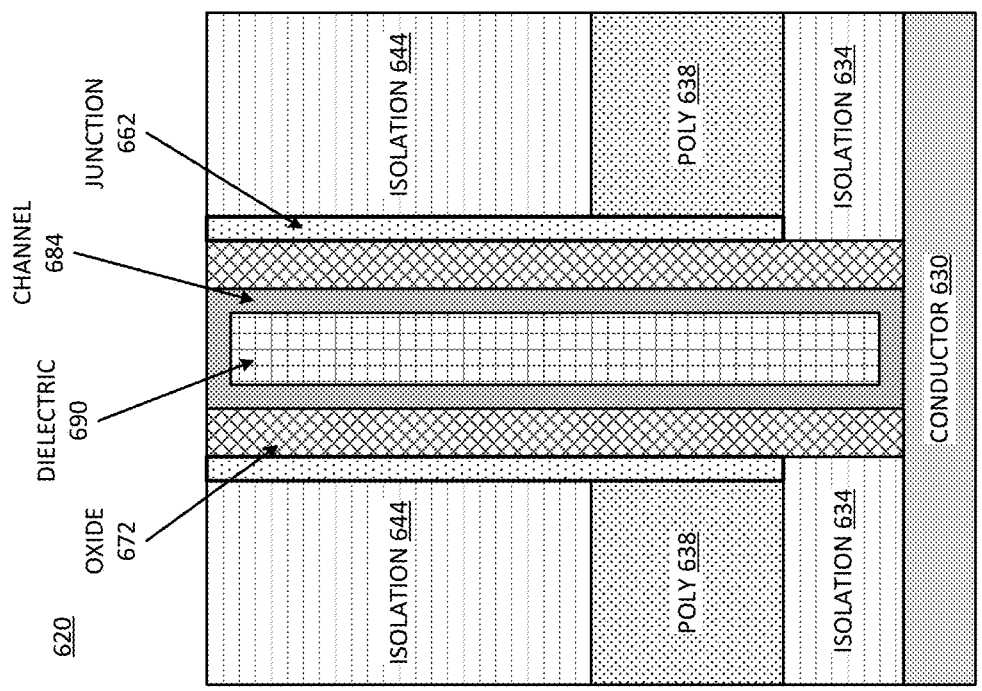

FIG. 6K illustrates circuit state 620, in which the processing can cap the channel by removing some of dielectric 690 can creating more channel conductor over the dielectric. Thus, in one example, the channel conductor completely surrounds dielectric 690. The new structure of the channel conductor is represented as channel 684.

FIG. 6L illustrates circuit state 622, in which the processing can create conductor 692 over the top of the circuit, including over isolation 644 and over channel 684. In one example, some of conductor 692 and some of conductor 630 diffuse into channel 684. Conductor 692 can be a metal or a highly doped polysilicon (e.g., N+ doped poly), or a combination of metal and poly.

FIGS. 7A-7L are diagrammatic representations of a cross-section of stages of processing of a vertical string driver with a source-connected junction. For purposes of example, FIGS. 7A-7L illustrate the processing to create a vertical string driver with a field management structure. The circuit states illustrated in FIGS. 7A-7L can apply to any example of a vertical string driver with a junction structure as a field management structure, such as circuit 300. As illustrated, vertical stacking can refer to any processing that extends circuit elements out or up and away from the semiconductor substrate on which the devices are processed.

Figure 7B:
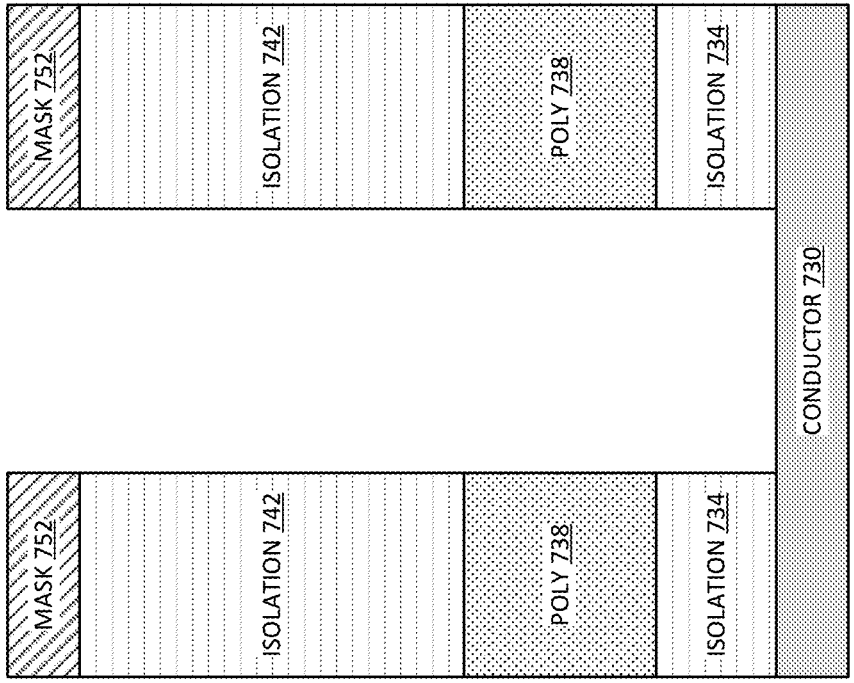
Figure 7A:
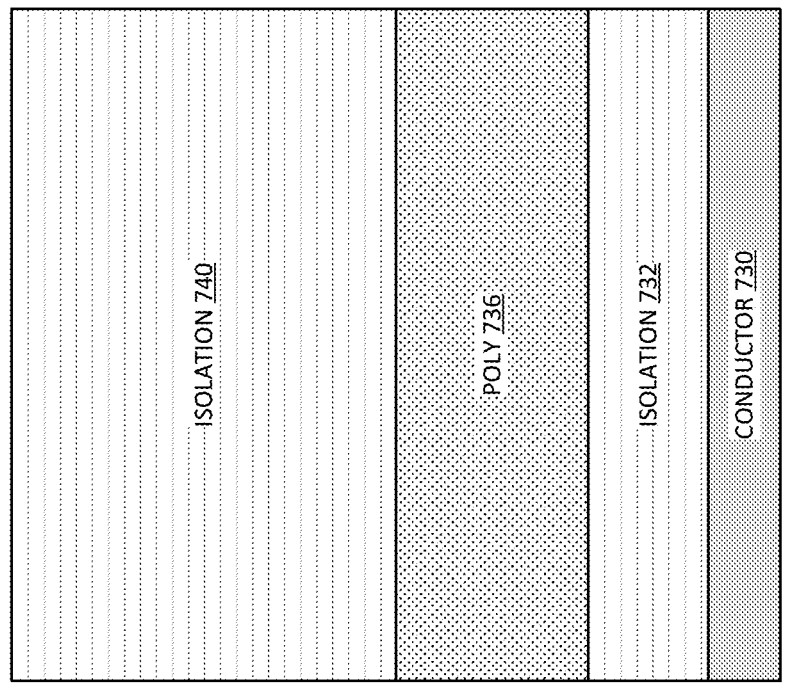

FIG. 7A illustrates circuit state 700, which can be referred to as an initial state, in which conductor 730 is processed on a semiconductor substrate (e.g., a silicon wafer). The semiconductor substrate is not specifically illustrated. Conductor 730 can be a metal or a highly doped polysilicon (e.g., N+ doped poly), or a combination of metal and poly. For example, a metal layer can be deposited, followed by a poly silicon that will provide advantages to creation of other layers or provide a stop layer for etching, or some other processing improvement.

Isolation layer 732 provides a separation between the conductor 730 and the doped poly material of poly 736. Poly 736 represents a poly material for a select gate that can be used to activate the operation of the vertical string driver. In one example, poly 736 is a P+ doped poly. In one example, isolation 740 is processed on poly 736. Poly 736 is for the gate, and isolation 740 provides an isolation layer between gate 736 and the drain.

FIG. 7B illustrates circuit state 702, in which the processing etches or removes material for a channel pillar from the initial state 700. Mask 752 represents a lithographic mask, such as a photoresist layer. Mask 752 represents a patterned material that can shield areas not to be removed, and expose areas to be removed. Mask 752 allows the removal of material from isolation layer 732 directly on top of conductor 730, from poly 736, and from isolation 740 on the gate poly layer. The resulting isolation layer structure on conductor 730 is represented as isolation 734. The resulting poly layer on isolation 734 is represented as poly 738. The resulting isolation layer on poly 734 is represented as isolation 742. In one example, the removal of material can be accomplished by dry etch.

Figure 7D:
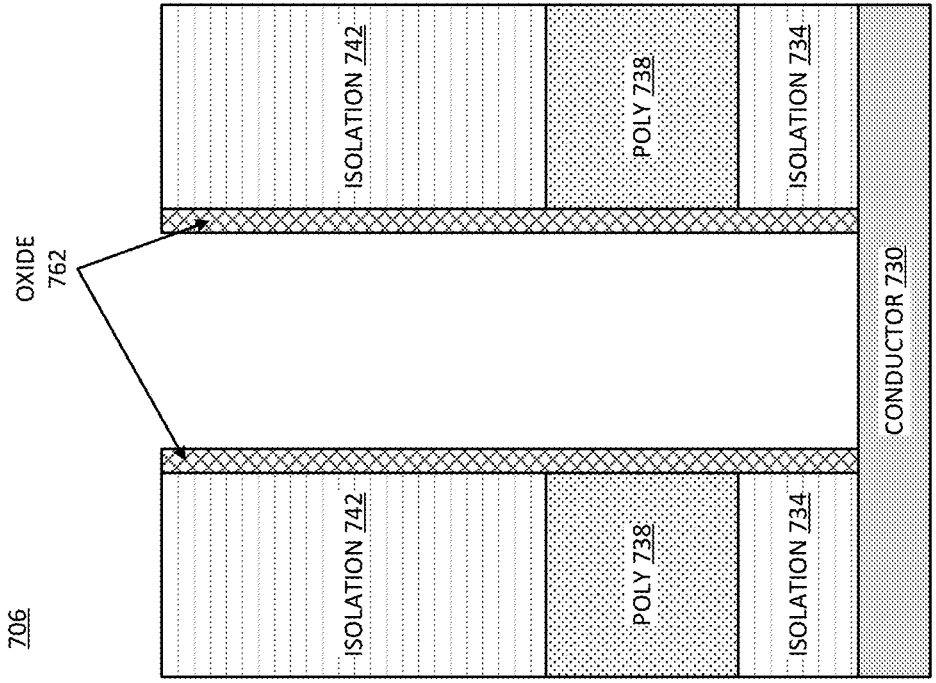
Figure 7C:
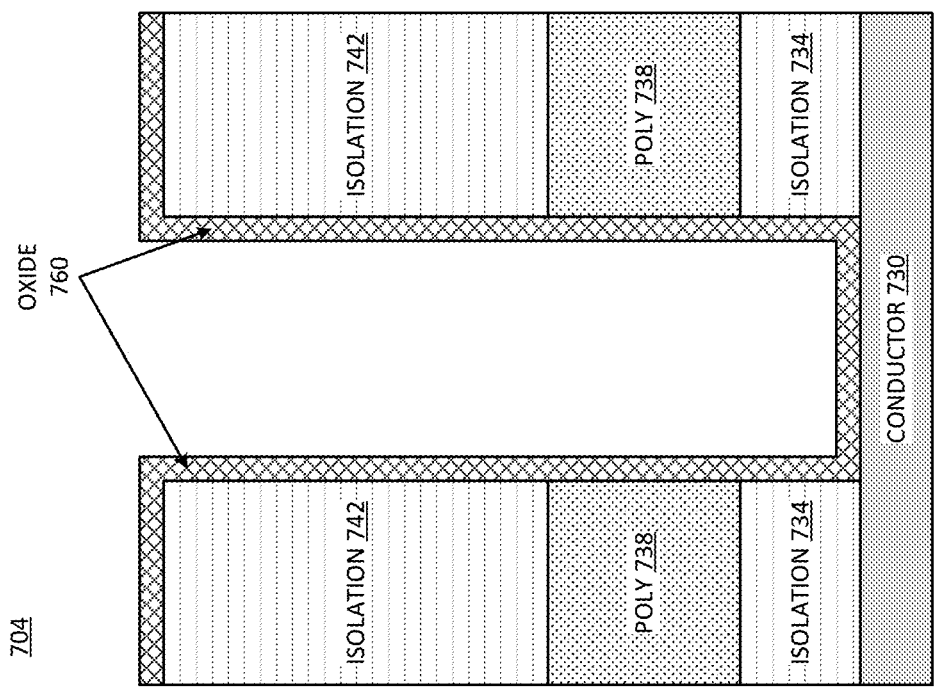

FIG. 7C illustrates circuit state 704, in which the processing creates oxide 760 over isolation 742, conductor 730, and over the walls of the channel pillar. In one example, isolation 734, isolation 742, and oxide 760 are the same material. In one example, instead of oxide, the processing can apply nitride for either isolation layer or for both isolation layers. In one example, the processing of oxide 760 can be performed by gate oxide deposition or thermal oxidation.

FIG. 7D illustrates circuit state 706, in which the processing removes oxide from isolation 742 and from conductor 730. The resulting structure is represented as oxide 762. In one example, the oxide can be removed by oxide etch.

Figure 7F:
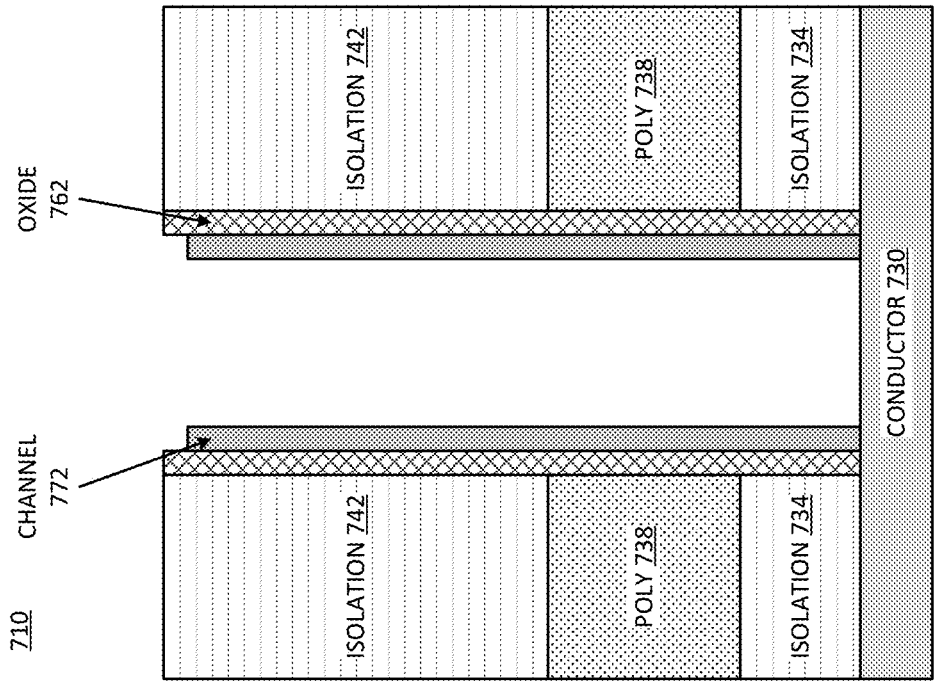
Figure 7E:
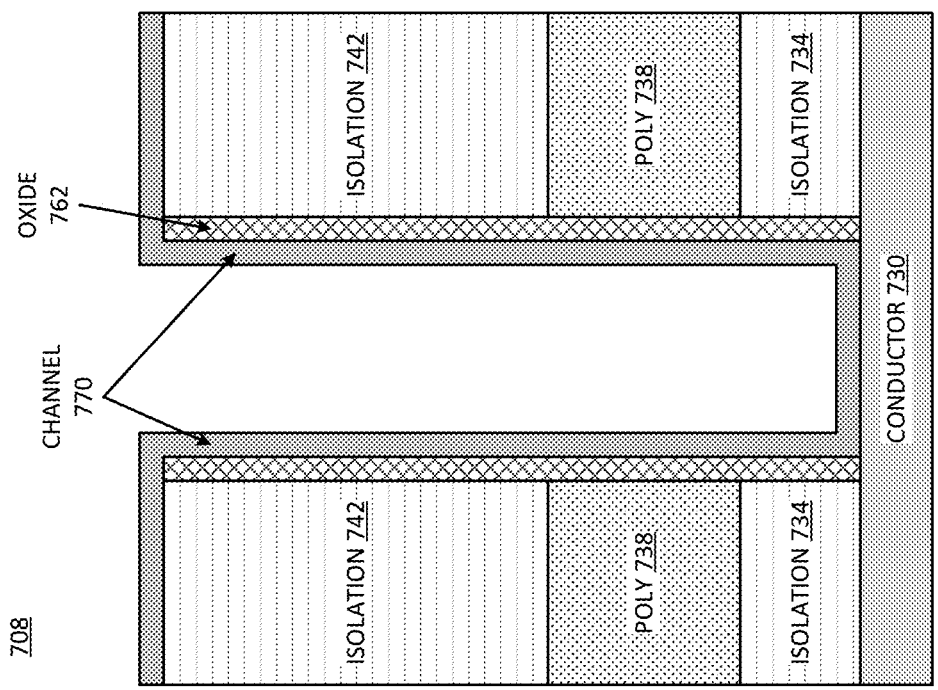

FIG. 7E illustrates circuit state 708, in which the processing can form the channel conductor. The channel conductor is represented as channel 770, formed over isolation 742, the walls of oxide 762, and conductor 730. In one example, the formation of channel 770 can be performed by n-type poly deposition.

FIG. 7F illustrates circuit state 710, in which the processing can remove the channel material from the top of isolation 742 and from conductor 730. The resulting channel structure is represented as channel 772. In one example, the removal of the channel material can be performed by poly silicon etch.

FIG. 7G illustrates circuit state 712, in which the processing creates oxide over isolation 742, conductor 730, and over channel 772. The oxide can be more gate oxide, and combine with the gate oxide previously deposited. The resulting oxide structure is represented as oxide 764, and surrounds the walls of channel 772. In one example, the processing of oxide 764 can be performed by gate oxide deposition or thermal oxidation.

FIG. 7H illustrates circuit state 714, in which the processing removes oxide from isolation 742 and from conductor 730. The resulting structure is represented as oxide 766. In one example, the oxide can be removed by oxide etch.

Figure 7J:
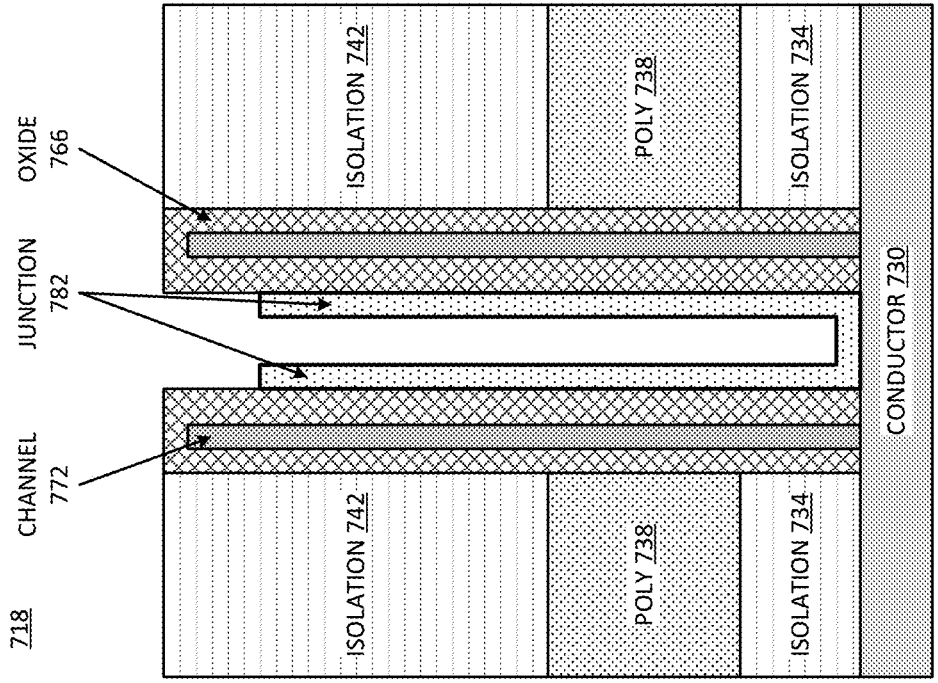
Figure 7I:
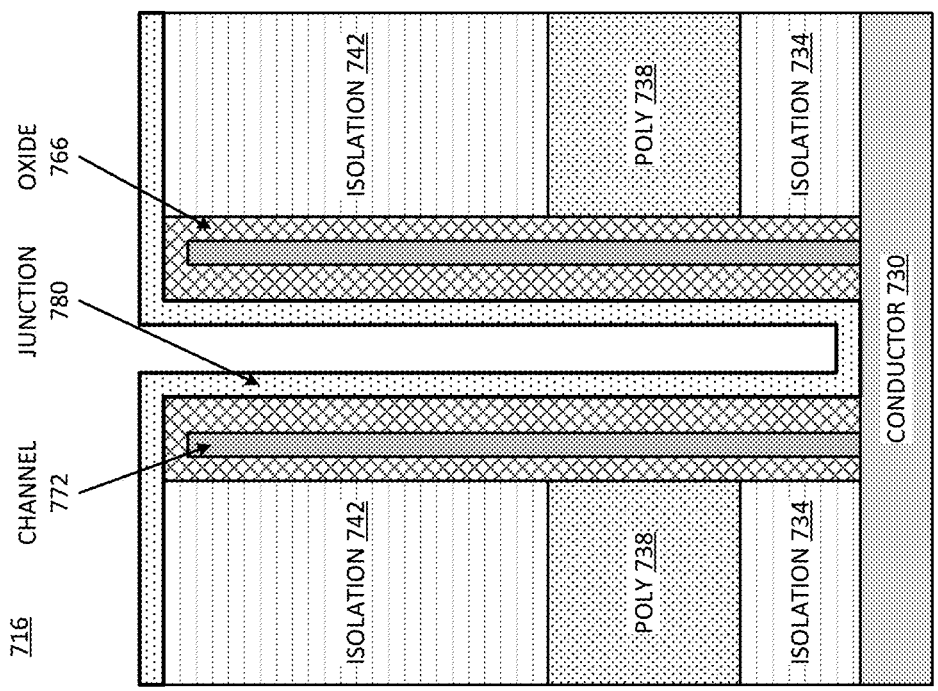

FIG. 7I illustrates circuit state 716, in which the processing forms material in the exposed area for the super junction. The resulting junction structure is represented as junction 780. In one example, the forming of junction 780 can be by deposition of p-type poly.

FIG. 7J illustrates circuit state 718, in which the processing can remove excess junction material. The resulting junction structure is illustrated as junction 782. In one example, the removal of the junction material can be performed by a poly silicon etch. In one example, the processing removes enough of the top of junction 782 to leave space between the junction structure and the drain. The height of the material to leave can be determined by how far the channel electric field is to be spread over the depletion region. In one example, the removal of junction 782 can be accomplished by poly etch.

Figure 7L:
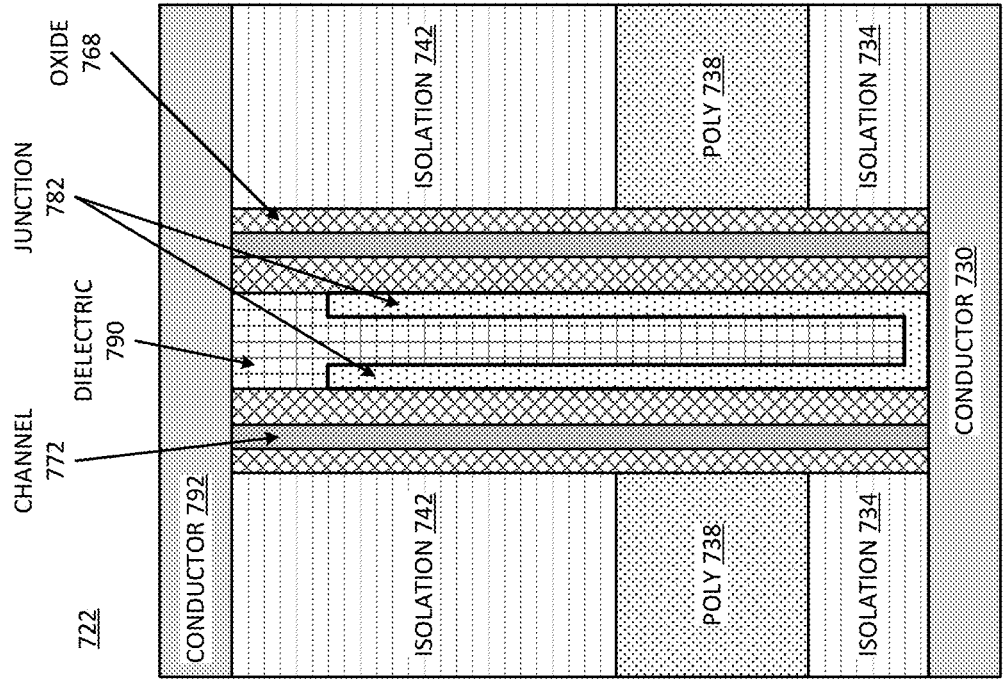
Figure 7K:
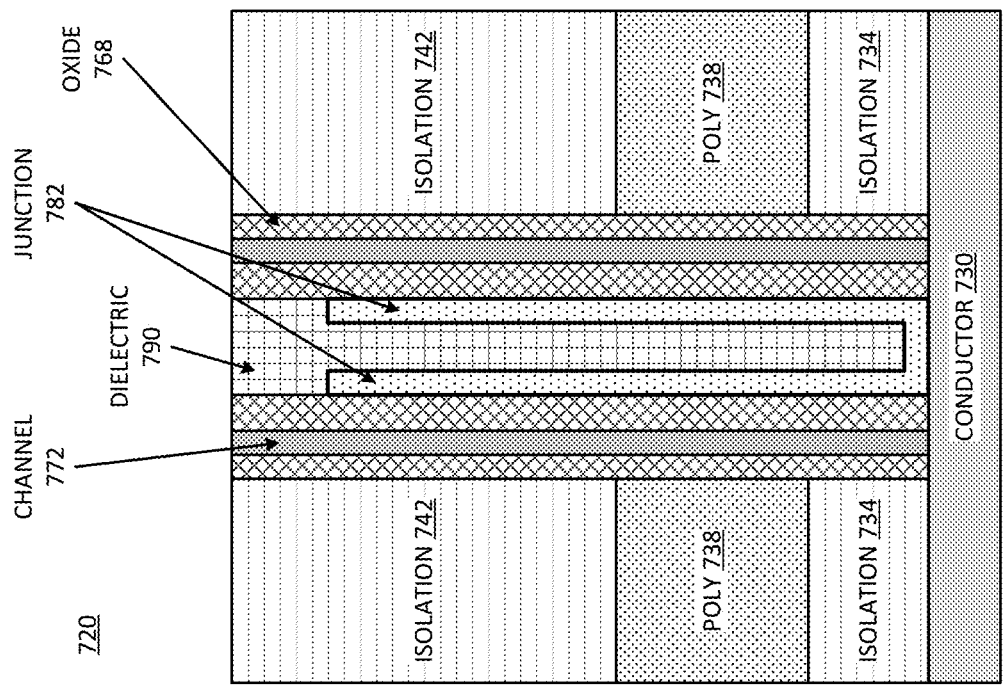

FIG. 7K illustrates circuit state 720, in which the processing can create dielectric 790. In one example, dielectric 790 is an oxide material. In one example, the creation of dielectric 790 can be performed by oxide deposition and chemical mechanical processing (CMP) or oxide etch. In one example, dielectric 790 fills the pillar or the space between the walls of junction 782. In one example, dielectric 790 also caps junction 782 to provide an isolation between the junction structure and the drain conductor. Dielectric 790 can be the material in the hollow channel. It will be understood that a hollow channel does not necessarily refer to a channel having no material inside it. Rather, a hollow channel refers to a channel where the conductive material for thin film wall, which is filled with a nonconductive material, such as oxide or nitride.

In one example, after forming dielectric 790, the processing removes oxide 766 that covers the top of channel 772. The resulting oxide structure is represented as oxide 768, which includes material on both sides of channel 772. In one example, the oxide on the inside of channel 772 (toward junction 782) is thicker than the oxide on the outside of channel 772 (toward gate poly 738).

FIG. 7L illustrates circuit state 722, in which the processing can create conductor 792 over the top of the circuit, including over isolation 742 and over channel 772. In one example, some of conductor 792 and some of conductor 730 diffuse into channel 772. Conductor 792 can be a metal or a highly doped polysilicon (e.g., N+ doped poly), or a combination of metal and poly.

Figure 8A:
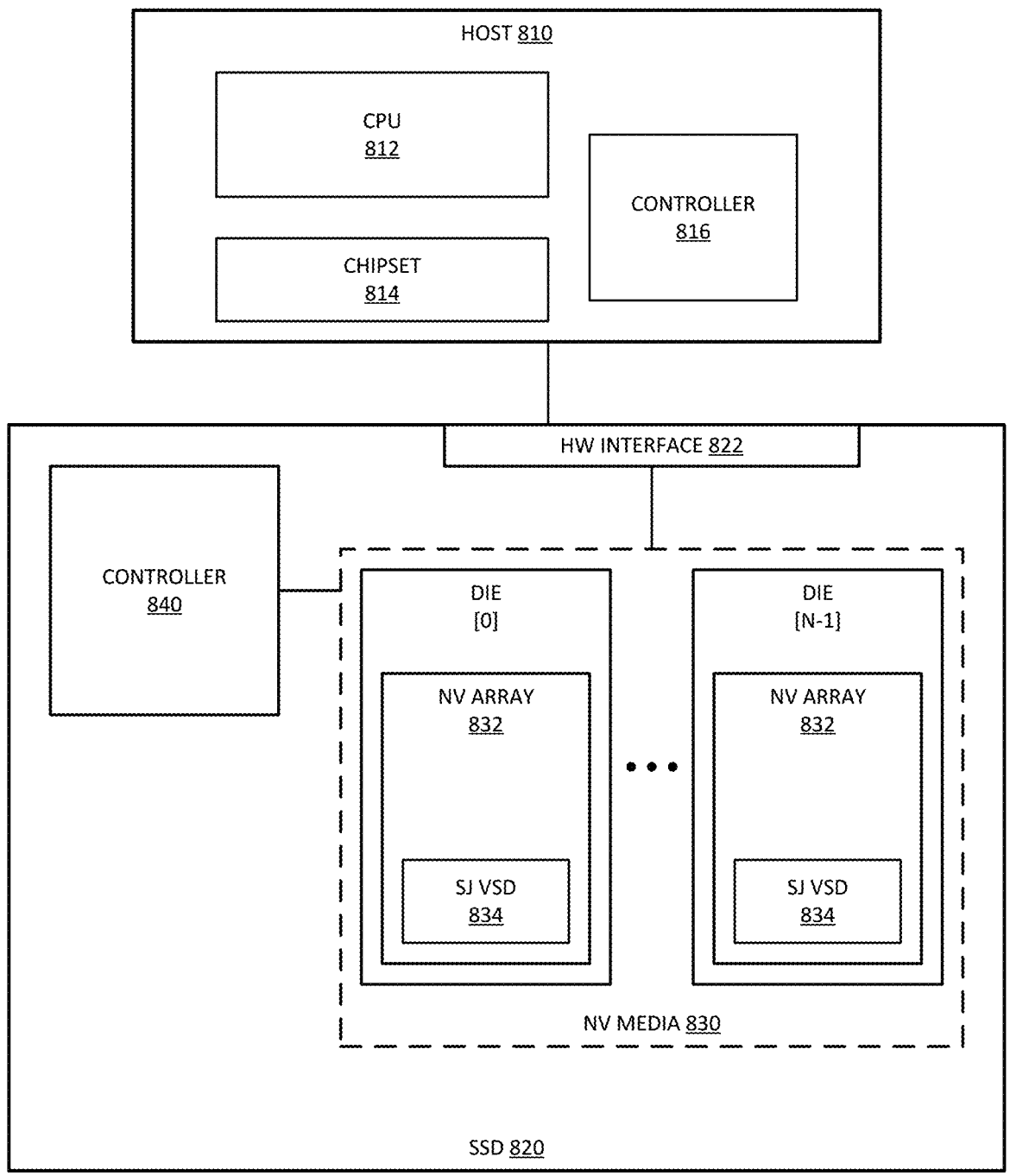
FIG. 8A is a block diagram of an example of a system with a hardware view of a solid state drive (SSD) with a nonvolatile array having vertical string drivers with extended gate junction structures.

FIG. 8A is a block diagram of an example of a system with a hardware view of a solid state drive (SSD) with a nonvolatile array having vertical string drivers with extended gate junction structures. System 802 represents components of a nonvolatile storage system that could implement nonvolatile media having a staircase structure with vertical string driver having field management structures in accordance with any example described, such as circuit 100, circuit 200, or circuit 300.

System 802 includes SSD 820 coupled with host 810. Host 810 represents a host hardware platform that connects to SSD 820. Host 810 includes CPU (central processing unit) 812 or other processor as a host processor or host processor device. CPU 812 represents any host processor that generates requests to access data stored on SSD 820, either to read the data or to write data to the storage. Such a processor can include a single or multicore processor, a primary processor for a computing device, a graphics processor, a peripheral processor, or a supplemental or auxiliary processor, or a combination. CPU 812 can execute a host OS and other applications to cause the operation of system 802.

Host 810 includes chipset 814, which represents hardware components that can be included in connecting between CPU 812 and SSD 820. For example, chipset 814 can include interconnect circuits and logic to enable access to SSD 820. Thus, host 810 can include a hardware platform drive interconnect to couple SSD 820 to host 810. Host 810 includes hardware to interconnect to the SSD. Likewise, SSD 820 includes corresponding hardware to interconnect to host 810.

Host 810 includes controller 816, which represents a storage controller or memory controller on the host side to control access to SSD 820. In one example, controller 816 is included in chipset 814. In one example, controller 816 is included in CPU 812. Controller 816 can be referred to as an NV memory controller to enable host 810 to schedule and organize commands to SSD 820 to read and write data.

SSD 820 represents a solid-state drive or other storage system or module that includes nonvolatile (NV) media 830 to store data. SSD 820 includes HW (hardware) interface 822, which represents hardware components to interface with host 810. For example, HW interface 822 can interface with one or more buses to implement a high speed interface standard such as NVMe (nonvolatile memory express) or PCIe (peripheral component interconnect express).

In one example, SSD 820 includes NV (nonvolatile) media 830 as the primary storage for SSD 820. In one example, NV media 830 is or includes a block addressable memory technology, such as NAND (not AND) or NOR (not OR). In one example, NV media 830 can include a nonvolatile, byte addressable media that stores data based on a resistive state of the memory cell, or a phase of the memory cell. For example, NV media 830 can be or include a three dimensional crosspoint (3DXP) memory or a storage array based on chalcogenide phase change material (e.g., chalcogenide glass). In one example, the NV media can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

In one example, NV media 830 is implemented as multiple dies, illustrated as N dies, Die[0:{N−1}]. N can be any number of devices, and is often a binary number. SSD 820 includes controller 840 to control access to NV media 830. Controller 840 represents hardware and control logic within SSD 820 to execute control over the media. Controller 840 is internal to the nonvolatile storage device or module, and is separate from controller 816 of host 810.

The NV dies of NV media 830 include 3D NV array 832, which is a three-dimensional array of storage cells based on the NV media. NV array 832 includes a staircase structure with vertical string drivers in accordance with any example herein. SJ VSD 834 represents super junction vertical string drivers, which represent vertical string drivers with super junction field management structures. SJ VSD 834 can be a string driver circuit to control current from a connector trace to an exposed connection of a wordline in the staircase region of the 3D NV array 832.

Figure 8B:
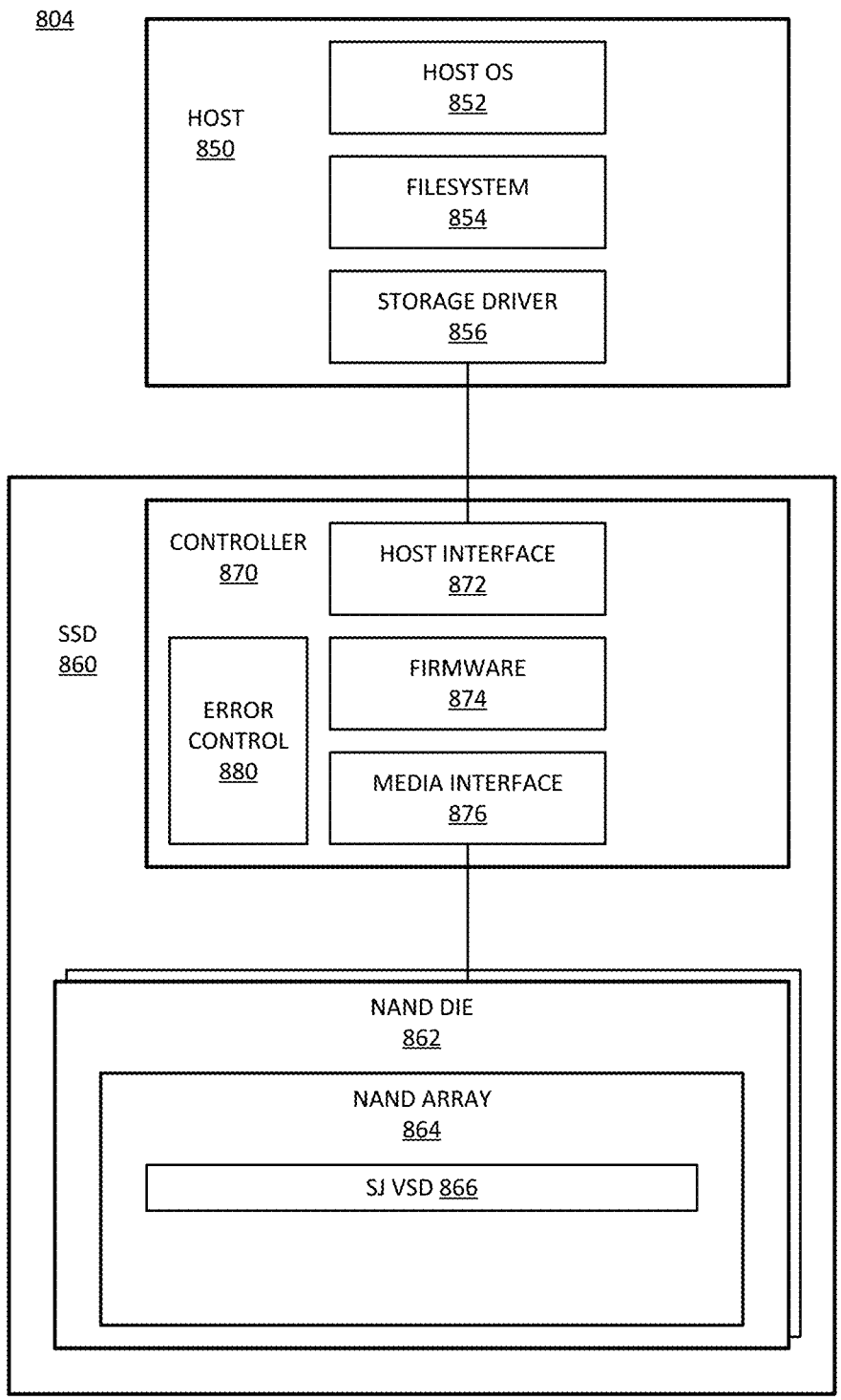
FIG. 8B is a block diagram of an example of a logical view of system with a solid state drive (SSD) with a nonvolatile array having vertical string drivers with extended gate junction structures.

FIG. 8B is a block diagram of an example of a logical view of system with a solid state drive (SSD) with a nonvolatile array having vertical string drivers with extended gate junction structures. System 804 provides one example of a system in accordance with system 802 of FIG. 8A. System 804 illustrates the logical layers of the host and SSD of a hardware platform in accordance with system 802. System 804 can represent software and firmware components of an example of system 802, as well as physical components. In one example, host 850 provides one example of host 810. In one example, SSD 860 provides one example of SSD 820.

In one example, host 850 includes host OS 852, which represents a host operating system or software platform for the host. Host OS 852 can include a platform on which applications, services, agents, and/or other software executes, and is executed by a processor. Filesystem 854 represents control logic for controlling access to the NV media. Filesystem 854 can manage what addresses or memory locations are used to store what data. There are numerous filesystems known, and filesystem 854 can implement known filesystems or other proprietary systems. In one example, filesystem 854 is part of host OS 852.

Storage driver 856 represents one or more system-level modules that control the hardware of host 850. In one example, drivers 856 include a software application to control the interface to SSD 860, and thus control the hardware of SSD 860. Storage driver 856 can provide a communication interface between the host and the SSD.

Controller 870 of SSD 860 includes firmware 874, which represents control software/firmware for the controller. In one example, controller 870 includes host interface 872, which represents an interface to host 850. In one example, controller 870 includes media interface 876, which represents an interface to NAND die 862. NAND die 862 represents a specific example of NV media, and includes an associated 3D NAND array 864. NAND array 864 includes a staircase structure with vertical string drivers in accordance with any example herein. SJ VSD 866 represents super junction vertical string drivers, which represent vertical string drivers with super junction field management structures. SJ VSD 866 can be a string driver circuit to control current from a connector trace to an exposed connection of a wordline in the staircase region of the 3D NAND array 864.

Media interface 876 represent control that is executed on hardware of controller 870. It will be understood that controller 870 includes hardware to interface with host 850, which can be considered to be controlled by host interface software/firmware 874. Likewise, it will be understood that controller 870 includes hardware to interface with NAND die 862. In one example, code for host interface 872 can be part of firmware 874. In one example, code for media interface 876 can be part of firmware 874.

In one example, controller 870 includes error control 880 to handle data errors in accessed data, and corner cases in terms of compliance with signaling and communication interfacing. Error control 880 can include implementations in hardware or firmware, or a combination of hardware and software.

Figure 9:
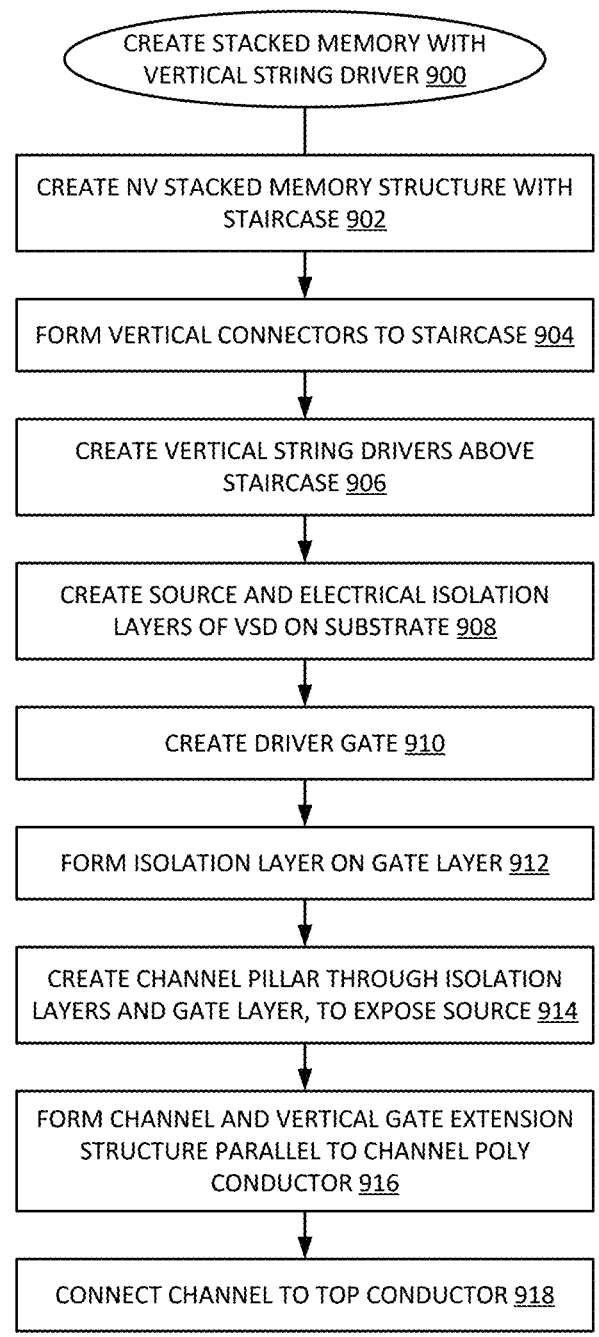
FIG. 9 is a flow diagram of an example of a process for creating a vertical string driver with an extended gate junction structure.

FIG. 9 is a flow diagram of an example of a process for creating a vertical string driver with an extended gate junction structure. Process 900 illustrates an example of a process to create a stacked memory or other 3D device with a vertical string driver.

In one example, the processing creates a nonvolatile stacked memory structure with a staircase region, at 902. In one example, the processing forms vertical connectors to the staircase, at 904. The vertical connectors allow selection of strings of circuit elements, such as bit cells.

In one example, the processing creates vertical string drivers to control the selection of the vertical connectors, at 906. The creation of the vertical string drivers can include creation of a source and electrical isolation layers of the VSD on a substrate, such as an oxide or isolation layer of the top of the staircase, at 908.

The processing creates a driver gate layer, at 910. The processing forms an isolation layer on the gate layer, at 912. The processing creates a channel pillar through the isolation layers and gate layer to expose the source conductor, at 914. In one example, the processing forms a channel and a vertical gate extension structure or super junction structure parallel to the channel poly conductor, at 916.

The field plate structure can be in accordance with any field plate structure described. In one example, the processing creates an electrical isolation layer over the field plate and gate, at 916. The isolation layer on the gate and below the drain conductor can be referred to as a second isolation layer.

In one example, the processing forms a vertical channel with a thin film doped polysilicon channel conductor. The vertical channel includes an oxide to electrically isolate the channel conductor from the gate conductor. In one example, the processing forms the junction structure along the gate oxide, with the junction structure to make electrical contact with the gate conductor. The processing can form the gate oxide, channel conductor, and channel dielectric after forming the junction material.

In one example, the processing forms the gate oxide and channel conductor prior to forming the junction structure. The junction structure can be formed inside the channel, electrically isolated from the channel conductor by gate oxide or dielectric, and to make electrical contact with the source conductor. The channel can still be considered a hollow channel because the conductor of the junction structure does not conduct when the channel is on. Rather the junction structure can extend along the channel conductor, electrically isolated, but able to spread the electric field of the channel conductor along a larger length of the channel than directly around the gate. The processing can finish the circuit by connecting the channel to the top conductor, at 918.

Figure 10:
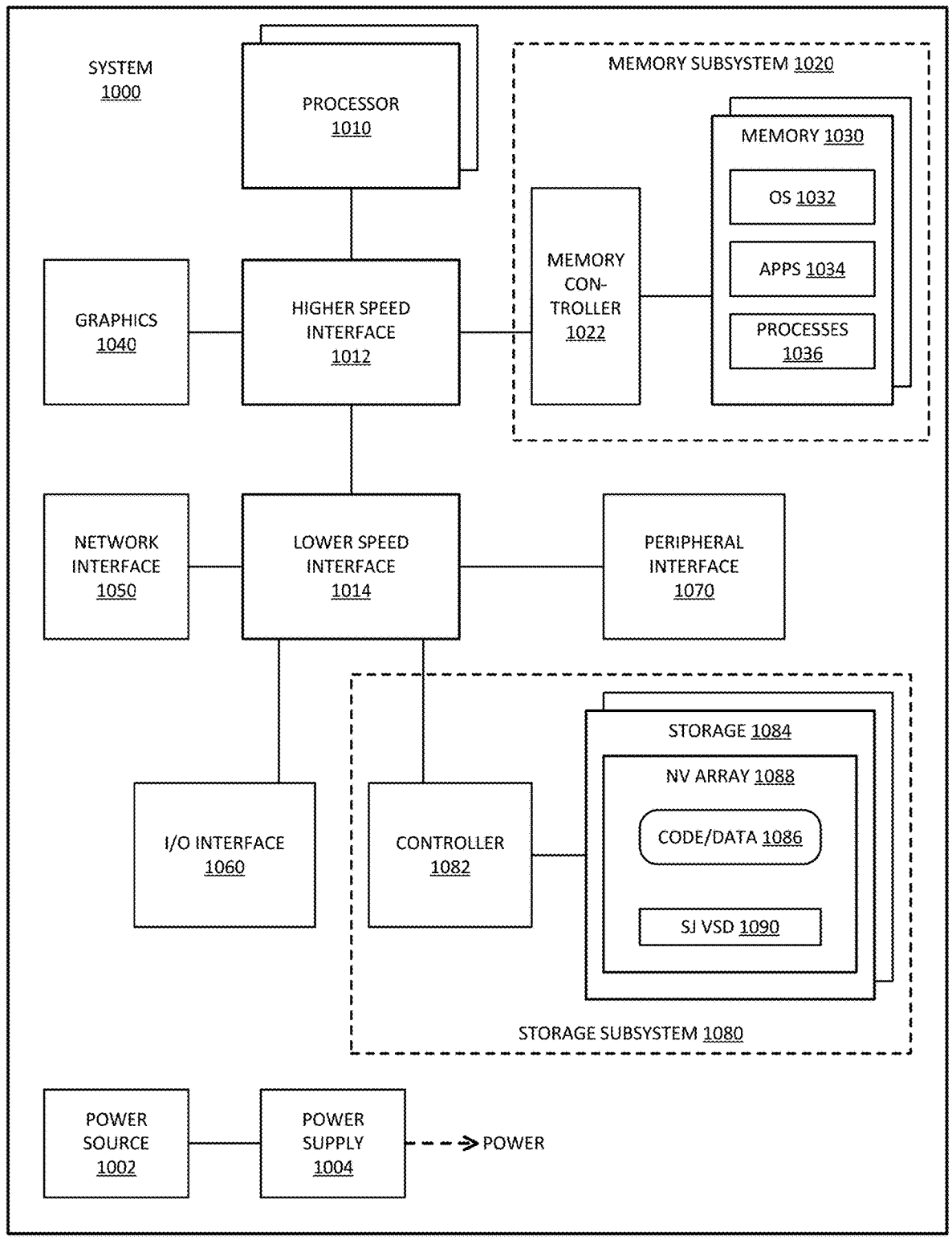
FIG. 10 is a block diagram of an example of a computing system in which a three dimensional memory with a vertical string driver with an extended gate junction structure can be implemented.

FIG. 10 is a block diagram of an example of a computing system in which a three dimensional memory with a vertical string driver with an extended gate junction structure can be implemented. System 1000 represents a computing device in accordance with any example herein, and can be a laptop computer, a desktop computer, a tablet computer, a server, a gaming or entertainment control system, embedded computing device, or other electronic device. System 1000 provides an example of a system that can include an SSD in accordance with system 802 or system 804, or another 3D stacked device with a vertical string driver having field management structure in accordance with circuit 100, circuit 200, or circuit 300.

In one example, system 1000 includes storage 1084 with NV array 1088. NV array 1088 can be, for example, a 3D NAND array. NV array 1088 includes a staircase structure with vertical string drivers in accordance with any example herein. SJ VSD 1090 represents super junction vertical string drivers, which represent vertical string drivers with super junction field management structures in accordance with any example described. SJ VSD 1090 can be a string driver circuit to control current from a connector trace to an exposed connection of a wordline in the staircase region of the NV array 1088.

System 1000 includes processor 1010 can include any type of microprocessor, central processing unit (CPU), graphics processing unit (GPU), processing core, or other processing hardware, or a combination, to provide processing or execution of instructions for system 1000. Processor 1010 can be a host processor device. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1000 includes interface 1012 coupled to processor 1010, which can represent a higher speed interface or a high throughput interface for system components that need higher bandwidth connections, such as memory subsystem 1020 or graphics interface components 1040. Interface 1012 represents an interface circuit, which can be a standalone component or integrated onto a processor die. Interface 1012 can be integrated as a circuit onto the processor die or integrated as a component on a system on a chip. Where present, graphics interface 1040 interfaces to graphics components for providing a visual display to a user of system 1000. Graphics interface 1040 can be a standalone component or integrated onto the processor die or system on a chip. In one example, graphics interface 1040 can drive a high definition (HD) display or ultra high definition (UHD) display that provides an output to a user. In one example, the display can include a touchscreen display. In one example, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more memory devices 1030 such as read-only memory (ROM), flash memory, one or more varieties of random-access memory (RAM) such as DRAM, 3DXP (three-dimensional crosspoint), or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010, such as integrated onto the processor die or a system on a chip.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1000 includes interface 1014, which can be coupled to interface 1012. Interface 1014 can be a lower speed interface than interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, 3DXP, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1000 to provide power to the components of system 1000. In one example, power supply 1004 includes an AC to DC (alternating current to direct current) adapter to plug into a wall outlet. Such AC power can be renewable energy (e.g., solar power) power source 1002. In one example, power source 1002 includes a DC power source, such as an external AC to DC converter. In one example, power source 1002 or power supply 1004 includes wireless charging hardware to charge via proximity to a charging field. In one example, power source 1002 can include an internal battery or fuel cell source.

Figure 11:
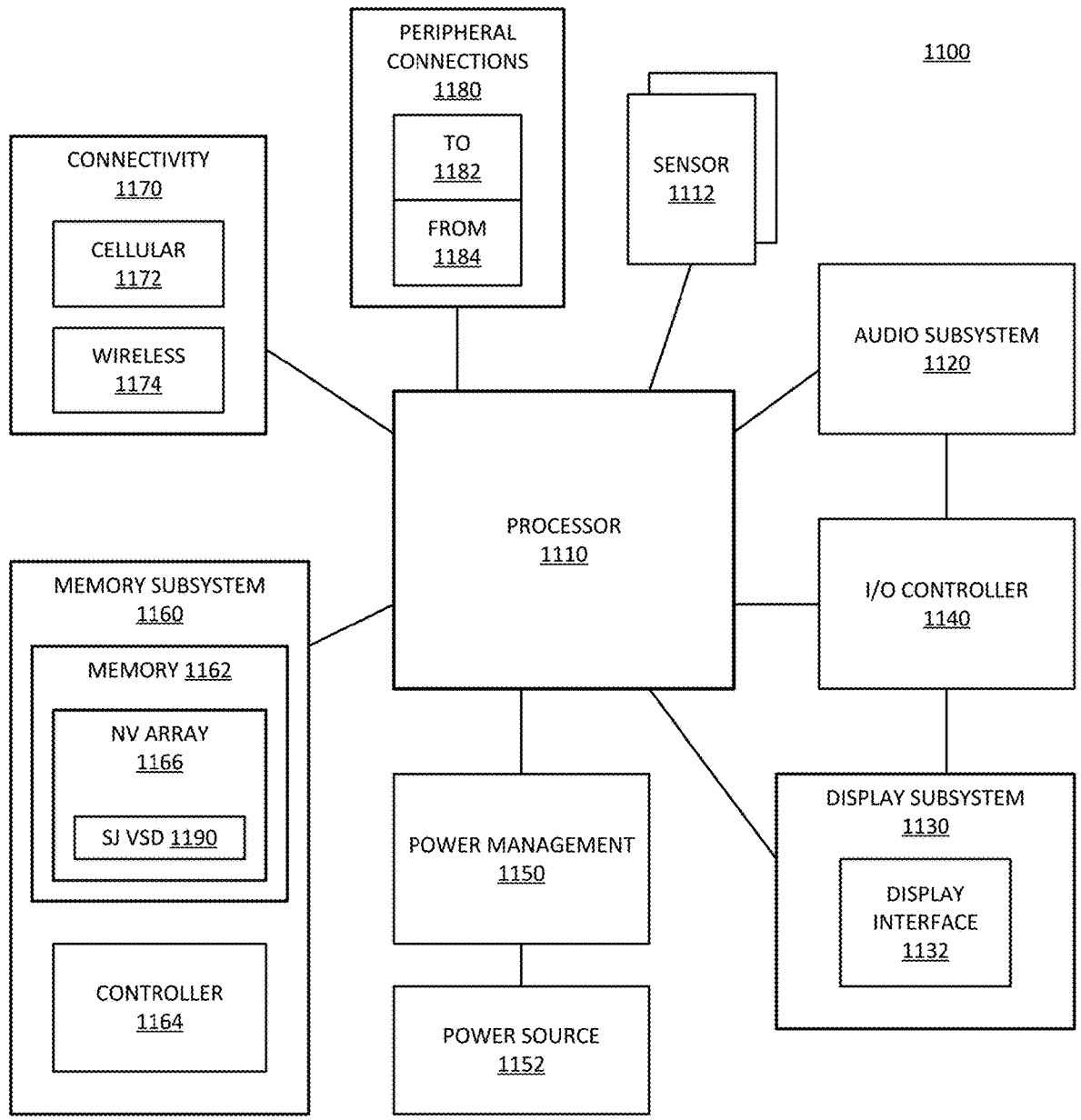
FIG. 11 is a block diagram of an example of a mobile device in which a three dimensional memory with a vertical string driver with an extended gate junction structure can be implemented.

FIG. 11 is a block diagram of an example of a mobile device in which a three dimensional memory with a vertical string driver with an extended gate junction structure can be implemented. System 1100 represents a mobile computing device, such as a computing tablet, a mobile phone or smartphone, wearable computing device, or other mobile device, or an embedded computing device. It will be understood that certain of the components are shown generally, and not all components of such a device are shown in system 1100. System 1100 provides an example of a system that can include a 3D stacked device with a vertical string driver having field management structure in accordance with circuit 100, circuit 200, or circuit 300.

In one example, system 1000 includes memory 1162 with NV array 1166. NV array 1166 can be, for example, a 3D NAND array. NV array 1166 includes a staircase structure with vertical string drivers in accordance with any example herein. SJ VSD 1190 represents super junction vertical string drivers, which represent vertical string drivers with super junction field management structures in accordance with any example described. SJ VSD 1190 can be a string driver circuit to control current from a connector trace to an exposed connection of a wordline in the staircase region of the NV array 1166.

System 1100 includes processor 1110, which performs the primary processing operations of system 1100. Processor 1110 can be a host processor device. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting system 1100 to another device, or a combination. The processing operations can also include operations related to audio I/O, display I/O, or other interfacing, or a combination. Processor 1110 can execute data stored in memory. Processor 1110 can write or edit data stored in memory.

In one example, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one example, one or more sensors 1112 couples to processor 1110 via a frontend circuit integrated with processor 1110. In one example, one or more sensors 1112 couples to processor 1110 via another component of system 1100.

In one example, system 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1100, or connected to system 1100. In one example, a user interacts with system 1100 by providing audio commands that are received and processed by processor 1110.

Display subsystem 1130 represents hardware (e.g., display devices) and software components (e.g., drivers) that provide a visual display for presentation to a user. In one example, the display includes tactile components or touchscreen elements for a user to interact with the computing device. Display subsystem 1130 includes display interface 1132, which includes the particular screen or hardware device used to provide a display to a user. In one example, display interface 1132 includes logic separate from processor 1110 (such as a graphics processor) to perform at least some processing related to the display. In one example, display subsystem 1130 includes a touchscreen device that provides both output and input to a user. In one example, display subsystem 1130 includes a high definition (HD) or ultra-high definition (UHD) display that provides an output to a user. In one example, display subsystem includes or drives a touchscreen display. In one example, display subsystem 1130 generates display information based on data stored in memory or based on operations executed by processor 1110 or both.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to system 1100 through which a user might interact with the system. For example, devices that can be attached to system 1100 might include microphone devices, speaker or stereo systems, video systems or other display device, keyboard or keypad devices, buttons/switches, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of system 1100. Additionally, audio output can be provided instead of or in addition to display output. In another example, if display subsystem includes a touchscreen, the display device also acts as an input device, which can be at least partially managed by I/O controller 1140. There can also be additional buttons or switches on system 1100 to provide I/O functions managed by I/O controller 1140.

In one example, I/O controller 1140 manages devices such as accelerometers, cameras, light sensors or other environmental sensors, gyroscopes, global positioning system (GPS), or other hardware that can be included in system 1100, or sensors 1112. The input can be part of direct user interaction, as well as providing environmental input to the system to influence its operations (such as filtering for noise, adjusting displays for brightness detection, applying a flash for a camera, or other features).

In one example, system 1100 includes power management 1150 that manages battery power usage, charging of the battery, and features related to power saving operation. Power management 1150 manages power from power source 1152, which provides power to the components of system 1100. In one example, power source 1152 includes an AC to DC (alternating current to direct current) adapter to plug into a wall outlet. Such AC power can be renewable energy (e.g., solar power, motion based power). In one example, power source 1152 includes only DC power, which can be provided by a DC power source, such as an external AC to DC converter. In one example, power source 1152 includes wireless charging hardware to charge via proximity to a charging field. In one example, power source 1152 can include an internal battery or fuel cell source.

Memory subsystem 1160 includes memory device(s) 1162 for storing information in system 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one example, memory subsystem 1160 includes memory controller 1164 (which could also be considered part of the control of system 1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable system 1100 to communicate with external devices. The external device could be separate devices, such as other computing devices, wireless access points or base stations, as well as peripherals such as headsets, printers, or other devices. In one example, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, system 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that system 1100 could both be a peripheral device ("to" 1182) to other computing devices, as well as have peripheral devices ("from" 1184) connected to it. System 1100 commonly has a "docking" connector to connect to other computing devices for purposes such as managing (e.g., downloading, uploading, changing, synchronizing) content on system 1100. Additionally, a docking connector can allow system 1100 to connect to certain peripherals that allow system 1100 to control content output, for example, to audiovisual or other systems.

In addition to a proprietary docking connector or other proprietary connection hardware, system 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a driver circuit includes: a gate layer between a source conductor and a drain conductor, vertically separated from the source conductor by a first electrical isolation layer, and vertically separated from the drain conductor by a second electrical isolation layer, the gate layer including a gate conductor; a vertical channel intersecting the gate layer, the vertical channel including a channel conductor to connect vertically between the source conductor and the drain conductor, and an oxide layer between the channel conductor and the gate conductor; and a junction structure extending in parallel with the channel conductor, extending vertically toward the drain conductor, having a height greater than a height of the gate layer.

In one example, the channel conductor comprises n-type (electron-majority-carrier) doped polysilicon. In one example, the channel conductor comprises doped metal oxide. In one example, the doped metal oxide comprises zinc oxide (ZnO). In one example, the gate conductor comprises p-type (hole-majority-carrier) doped polysilicon. In one example, the junction structure comprises p-type (hole-majority-carrier) doped polysilicon. In one example, the gate conductor has a higher doping density than the junction structure. In one example, junction structure comprises a vertical structure between the oxide layer and the gate conductor, wherein the junction structure is electrically connected to the gate conductor. In one example, the vertical channel further comprises a dielectric material surrounded by the channel conductor, wherein the junction structure comprises a vertical structure between the channel conductor and the dielectric material, wherein the junction structure is electrically connected to the source conductor.

In general with respect to the descriptions herein, in one example a NAND memory device includes: a three-dimensional (3D) NAND array, the 3D NAND array including cells vertically stacked in a staircase pattern, with steps in the staircase to expose connections to wordlines of the 3D NAND array; and a driver circuit to control current from a connector trace to an exposed connection to a wordline of the 3D NAND array, the driver circuit including: a gate layer between a source conductor and a drain conductor, vertically separated from the source conductor by a first electrical isolation layer, and vertically separated from the drain conductor by a second electrical isolation layer, the gate layer including a gate conductor, wherein the drain conductor is electrically connected to the connector trace and the source conductor is electrically connected to a conductive pillar that electrically connected to the exposed connection to the wordline; a vertical channel intersecting the gate layer, the vertical channel including a channel conductor to connect vertically between the source conductor and the drain conductor, and an oxide layer between the channel conductor and the gate conductor; and a junction structure extending in parallel with the channel conductor, extending vertically toward the drain conductor, having a height greater than a height of the gate layer.

In one example, the channel conductor comprises n-type (electron-majority-carrier) doped polysilicon or n-type doped metal oxide. In one example, the gate conductor comprises p-type (hole-majority-carrier) doped polysilicon. In one example, the junction structure comprises p-type (hole-majority-carrier) doped polysilicon. In one example, the gate conductor has a higher doping density than the junction structure. In one example, the junction structure comprises a vertical structure between the oxide layer and the gate conductor, wherein the junction structure is electrically connected to the gate conductor. In one example, the vertical channel further comprises a dielectric material surrounded by the channel conductor, wherein the junction structure comprises a vertical structure between the channel conductor and the dielectric material, wherein the junction structure is electrically connected to the source conductor. In one example, the driver circuit comprises a driver circuit at a top of the 3D NAND array staircase.

In general with respect to the descriptions herein, in one example a method for creating a driver device includes: forming a first electrical isolation layer on a source conductor; forming a gate conductor on the first electrical isolation layer; forming a second electrical isolation layer on the gate conductor; forming a vertical channel through the second electrical isolation layer, the gate conductor, and the first electrical isolation layer, the vertical channel having a channel conductor to electrically contact the source conductor, and an oxide to electrically isolate the channel conductor from the gate conductor; forming a vertical junction structure parallel to the channel conductor, extending vertically toward a drain conductor, having a height greater than a height of the gate conductor; and forming a drain conductor to electrically contact the channel conductor.

In one example, forming the vertical junction structure comprises forming a vertical conductor between a gate oxide and the gate conductor, wherein the vertical junction structure is electrically connected to the gate conductor. In one example, forming channel further comprises forming the vertical junction structure electrically connected to the gate conductor. In one example, forming the vertical junction structure comprises forming a vertical conductor between the channel conductor and a dielectric material of the vertical channel, wherein the junction structure is electrically connected to the source conductor. In one example, forming channel further comprises forming the vertical junction structure electrically connected to the source conductor.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A driver circuit comprising:
   a gate layer between a source conductor and a drain conductor, vertically separated from the source conductor by a first electrical isolation layer, and vertically separated from the drain conductor by a second electrical isolation layer, the gate layer including a gate conductor;
   a vertical channel intersecting the gate layer, the vertical channel including a channel conductor to connect vertically between the source conductor and the drain conductor, and a gate oxide layer between the channel conductor and the gate conductor; and
   a junction structure extending in parallel with the channel conductor, extending vertically toward the drain conductor, separated from the channel conductor by a junction oxide layer, having a height greater than a height of the gate layer.

2. The driver circuit of claim 1, wherein the channel conductor comprises n-type (electron-majority-carrier) doped polysilicon.

3. The driver circuit of claim 1, wherein the channel conductor comprises doped metal oxide.

4. The driver circuit of claim 3, wherein the doped metal oxide comprises zinc oxide (ZnO).

5. The driver circuit of claim 1, wherein the gate conductor comprises p-type (hole-majority-carrier) doped polysilicon.

6. The driver circuit of claim 5, wherein the junction structure comprises p-type (hole-majority-carrier) doped polysilicon.

7. The driver circuit of claim 6, wherein the gate conductor has a higher doping density than the junction structure.

8. The driver circuit of claim 1, wherein the junction structure comprises a vertical structure electrically connected to the gate conductor, wherein the gate oxide layer comprises the junction oxide layer.

9. The driver circuit of claim 1, wherein the vertical channel further comprises a dielectric material surrounded by the channel conductor, wherein the junction structure comprises a vertical structure between the channel conductor and the dielectric material with the junction oxide layer between the channel conductor and the junction structure, wherein the junction structure is electrically connected to the source conductor.

10. A NAND memory device, comprising:
    a three-dimensional (3D) NAND array, the 3D NAND array including cells vertically stacked in a staircase pattern, with steps in the staircase to expose connections to wordlines of the 3D NAND array; and a driver circuit to control current from a connector trace to an exposed connection to a wordline of the 3D NAND array, the driver circuit including:
- a gate layer between a source conductor and a drain conductor, vertically separated from the source conductor by a first electrical isolation layer, and vertically separated from the drain conductor by a second electrical isolation layer, the gate layer including a gate conductor, wherein the drain conductor is electrically connected to the connector trace and the source conductor is electrically connected to a conductive pillar that electrically connected to the exposed connection to the wordline;
- a vertical channel intersecting the gate layer, the vertical channel including a channel conductor to connect vertically between the source conductor and the drain conductor, and a gate oxide layer between the channel conductor and the gate conductor; and
- a junction structure extending in parallel with the channel conductor, extending vertically toward the drain conductor, separated from the channel conductor by a junction oxide layer, having a height greater than a height of the gate layer.

11. The NAND memory device of claim 10, wherein the channel conductor comprises n-type (electron-majority-carrier) doped polysilicon or n-type doped metal oxide.

12. The NAND memory device of claim 10, wherein the gate conductor comprises p-type (hole-majority-carrier) doped polysilicon.

13. The NAND memory device of claim 12, wherein the junction structure comprises p-type (hole-majority-carrier) doped polysilicon.

14. The NAND memory device of claim 13, wherein the gate conductor has a higher doping density than the junction structure.

15. The NAND memory device of claim 10, wherein the junction structure comprises a vertical structure electrically connected to the gate conductor, wherein the gate oxide layer comprises the junction oxide layer.

16. The NAND memory device of claim 10, wherein the vertical channel further comprises a dielectric material surrounded by the channel conductor, wherein the junction structure comprises a vertical structure between the channel conductor and the dielectric material with the junction oxide layer between the channel conductor and the junction structure, wherein the junction structure is electrically connected to the source conductor.

17. The NAND memory device of claim 10, wherein the driver circuit comprises a driver circuit at a top of the 3D NAND array staircase.

18. A method for creating a driver device, comprising:
- forming a first electrical isolation layer on a source conductor;
- forming a gate conductor on the first electrical isolation layer;
- forming a second electrical isolation layer on the gate conductor;
- forming a vertical channel through the second electrical isolation layer, the gate conductor, and the first electrical isolation layer, the vertical channel having a channel conductor to electrically contact the source conductor, and a gate oxide to electrically isolate the channel conductor from the gate conductor;
- forming a vertical junction structure parallel to the channel conductor, extending vertically toward a drain conductor, separated from the channel conductor by a junction oxide layer, having a height greater than a height of the gate conductor; and
- forming a drain conductor to electrically contact the channel conductor.

19. The method of claim 18, wherein forming the vertical junction structure comprises forming the vertical junction structure electrically connected to the gate conductor, wherein the gate oxide comprises the junction oxide.

20. The method of claim 19, wherein forming the vertical channel further comprises forming the vertical junction structure electrically connected to the gate conductor.

21. The method of claim 18, wherein forming the vertical junction structure comprises forming a vertical conductor between the channel conductor and a dielectric material of the vertical channel, wherein the vertical junction structure is electrically connected to the source conductor and the dielectric material comprises the junction oxide.

22. The method of claim 21, wherein forming the vertical channel further comprises forming the vertical junction structure electrically connected to the source conductor.

* * * * *